US010319439B1

United States Patent
Li et al.

(10) Patent No.: US 10,319,439 B1
(45) Date of Patent: Jun. 11, 2019

(54) RESISTIVE PROCESSING UNIT WEIGHT READING VIA COLLECTION OF DIFFERENTIAL CURRENT FROM FIRST AND SECOND MEMORY ELEMENTS

(71) Applicant: International Business Machines Corporation, Armonk, NY (US)

(72) Inventors: Yulong Li, Westchester, NY (US); Paul M. Solomon, Westchester, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/979,759

(22) Filed: May 15, 2018

(51) Int. Cl.
*G11C 11/34* (2006.01)
*G11C 13/00* (2006.01)
*G11C 11/54* (2006.01)
*G06N 3/08* (2006.01)
*G11C 27/00* (2006.01)

(52) U.S. Cl.
CPC ............ *G11C 13/004* (2013.01); *G06N 3/08* (2013.01); *G11C 11/54* (2013.01); *G11C 27/00* (2013.01); *G11C 2013/005* (2013.01)

(58) Field of Classification Search
CPC ............ G11C 11/5628; G11C 11/5642; G11C 11/5621; G11C 2211/5621
USPC ............................................. 365/185.03, 148
See application file for complete search history.

(56) References Cited

U.S. PATENT DOCUMENTS

| | | | |
|---|---|---|---|
| 8,045,361 B2 | 10/2011 | Lee et al. | |
| 8,681,549 B2* | 3/2014 | Shalvi | G11C 11/56 365/185.09 |
| 9,514,817 B1 | 12/2016 | Chang et al. | |
| 9,852,790 B1 | 12/2017 | Gokmen et al. | |
| 2015/0019468 A1 | 1/2015 | Nugent et al. | |
| 2015/0371705 A1 | 12/2015 | Onkaraiah et al. | |
| 2016/0336064 A1 | 11/2016 | Seo et al. | |
| 2017/0017879 A1 | 1/2017 | Kataeva et al. | |
| 2018/0033483 A1* | 2/2018 | Bertin | B82Y 10/00 |

FOREIGN PATENT DOCUMENTS

EP    1930909 A2    6/2008

OTHER PUBLICATIONS

M.V. Nair et al., "A Differential Memristive Synapse Circuit for On-Line Learning in Neuromorphic Computing Systems," Nano Futures, Nov. 17, 2017, 13 pages, vol. 1, No. 3.
(Continued)

*Primary Examiner* — Son T Dinh
(74) *Attorney, Agent, or Firm* — Vazken Alexanian; Ryan, Mason & Lewis, LLP

(57) ABSTRACT

A resistive processing unit includes a first analog memory element, a second analog memory element connected in series with the first analog memory element, and a control circuit coupled to the first analog memory element and the second analog memory element. The control circuit is configured to read a synaptic weight value of the resistive processing unit by collecting a differential current from the first analog memory element and the second analog memory element on at least one of a read column line and a read row line coupled to a terminal coupling the first analog memory element and the second analog memory element.

20 Claims, 21 Drawing Sheets

(56) References Cited

OTHER PUBLICATIONS

B. Li et al., "ICE: Inline Calibration for Memristor Crossbar-Based Computing Engine," Design, Automation and Test in Europe Conference and Exhibition (DATE), Mar. 24-28, 2014, 4 pages.

B. Li et al., "RRAM-Based Analog Approximate Computing," IEEE Transactions on Computer-Aided Design of Integrated Circuits and Systems, Dec. 2015, pp. 1905-1917, vol. 34, No. 12.

T. Gokmen et al., "Acceleration of Deep Neural Network Training with Resistive Cross Point Devices: Design Considerations," Frontiers in Neuroscience, Jul. 21, 2016, 13 pages, vol. 10, No. 333.

P.-Y. Chen et al., "Mitigating Effects of Non-Ideal Synaptic Device Characteristics for On-Chip Learning," IEEE/ACM International Conference on Computer-Aided Design (ICCAD), Nov. 2-6, 2015, pp. 194-199.

S. Agarwal et al., "Resistive Memory Device Requirements for a Neural Algorithm Accelerator," International Joint Conference on Neural Networks (IJCNN), Jul. 24-29, 2016, pp. 929-938.

S. Yu et al., "An Electronic Synapse Device Based on Metal Oxide Resistive Switching Memory for Neuromorphic Computation," IEEE Transactions on Electron Devices, Aug. 2011, pp. 2729-2737, vol. 58, No. 8.

\* cited by examiner

100

300

400

500

600

700

800

900

1000

1100

1200

1300

1400

1500

1600

1700

1800

RESISTIVE PROCESSING UNIT WEIGHT READING VIA COLLECTION OF DIFFERENTIAL CURRENT FROM FIRST AND SECOND MEMORY ELEMENTS

BACKGROUND

The present application relates to semiconductors, and more specifically, to techniques for forming resistive memory element semiconductor structures. Arrays of trainable resistive crosspoint devices, referred to herein as resistive processing units (RPUs), may be used to perform vector-matrix multiplication in an analog domain in a parallel fashion.

SUMMARY

Embodiments of the invention provide techniques for differential weight reading of resistive processing units having a pair of analog memory elements.

In one embodiment, a resistive processing unit comprises a first analog memory element, a second analog memory element connected in series with the first analog memory element, and a control circuit coupled to the first analog memory element and the second analog memory element, the control circuit configured to read a synaptic weight value of the resistive processing unit by collecting a differential current from the first analog memory element and the second analog memory element on at least one of a read column line and a read row line coupled to a terminal coupling the first analog memory element and the second analog memory element.

In another embodiment, an integrated circuit comprises an array of two or more resistive processing units. A given one of the resistive processing units comprises a first analog memory element, a second analog memory element connected in series with the first analog memory element, and a control circuit coupled to the first analog memory element and the second analog memory element, the control circuit configured to read out a synaptic weight value of the resistive processing unit by collecting a differential current from the first analog memory element and the second analog memory element.

In another embodiment, a method for differential weight reading of a resistive processing unit comprises applying a voltage difference across a first analog memory element and a second analog memory element of the resistive processing unit utilizing a control circuit, the first analog memory element being connected in series with the second analog memory element, applying one or more read pulse voltages utilizing the control circuit, and reading a synaptic weight value of the resistive processing unit by collecting a differential current from the first analog memory element and the second analog memory element on at least one of a read column line and a read row line coupled to a terminal between the first analog memory element and the second analog memory element.

DETAILED DESCRIPTION

Figure 1:
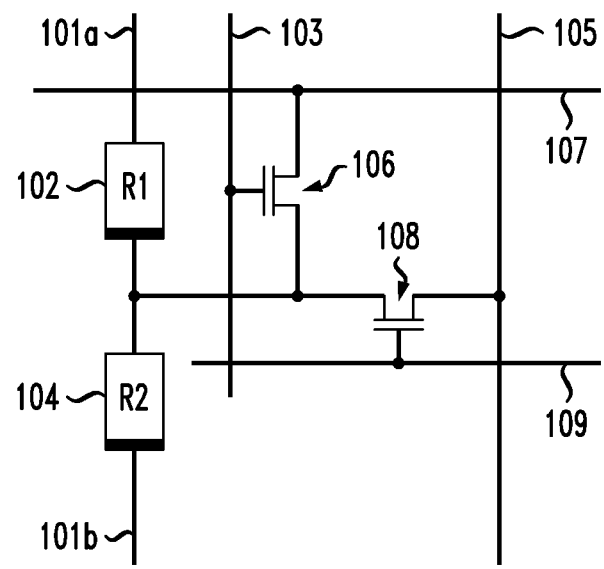
FIG. 1 depicts a circuit diagram of a differential resistive random-access memory (RRAM) resistive processing unit (RPU) unit cell, according to an embodiment of the present invention.

Illustrative embodiments of the invention may be described herein in the context of illustrative methods for differential weight reading of resistive processing units having pairs of analog memory elements, along with resistive processing units and arrays comprising such analog memory elements. However, it is to be understood that embodiments of the invention are not limited to the illustrative methods, apparatus, systems and devices but instead are more broadly applicable to other suitable methods, apparatus, systems and devices.

Resistive processing units (RPUs) may be used for various type of operations, such as those involving vector-matrix multiplication. One exemplary use case is in artificial neural networks (ANNs) formed from a cross-bar structure of RPUs that provide local data storage and local data processing without the need for additional processing elements, thereby accelerating an ability of an ANN to learn and implement algorithms such as stochastic gradient descent (SGD) and back propagation for online neural network training. To accommodate learning speed requirements for applications including learning in deep neural networks, there is a need for hardware innovation to provide analog weight update components. RPUs in a cross-bar structure may be used to enable parallel matrix multiplication, greatly enhancing neural network training and inference speed. Resistive random-access memory (RRAM) is a type of non-volatile memory that may be used as a synaptic device for neural network applications.

Machine learning is a term used herein to broadly describe a function of electronic systems that learn from data. In machine learning and cognitive science, ANNs are a family of statistical learning models. ANNs are inspired by biological neural networks of animals (e.g., the brain). ANNs may be used to estimate or approximate various systems and functions that depend on a large number of inputs, particularly where inputs are generally unknown.

ANNs may be embodied as "neuromorphic" systems of interconnected processor elements that act as simulated neurons and exchange messages between each other in the form of electronic signals. Similar to the so-called plasticity of synaptic neurotransmitter connections that carry messages between biological neurons, connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition may be defined by a set of input neurons, which may be activated by pixels of an input image. After being weighted and transformed by a function determined by a designer of the ANN, the activations of the input neurons are passed to other downstream neurons, often referred to as hidden neurons. This process is repeated until an output neuron is activated, with the activated output neuron determining which character was read.

Crossbar arrays, also referred to as crosspoint arrays or crosswire arrays, are high density and low cost circuit architectures used to form a variety of electronic circuits and devices, including but not limited to ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices.

Crosspoint devices, in effect, function as an ANN's weighted connections between neurons. Nanoscale two-terminal devices, such as resistive memory elements or memristors having "ideal" conduction state switching characteristics, may be used as the crosspoint devices in order to emulate synaptic plasticity with high energy efficiency. The conduction state (e.g., resistance) of the ideal memristor material may be altered by controlling voltages applied between individual wires of the row and column wires. Digital data may be stored by alteration of the memristor material's conduction state at the intersection to achieve a high conduction state or a low conduction state. The memristor material can also be programmed to maintain two or more distinct conduction states by selectively setting the conduction state of the material. The conduction state of the memristor material can be read by applying a voltage across the material and measuring the current that passes through the target crosspoint device.

A neural network may use back propagation for learning, which involves a forward pass, a backward pass and a weight update. In the forward pass, the input of each layer is multiplied with a weight matrix and fed to an activation function. The output becomes the input of next layer until the last layer is reached. The error, with respect to an ideal output, is then calculated through a loss function. In the backward pass, the network error of the last layer is propagated back to calculate the error of each previous layer. This may be done recursively by computing a local gradient for each neuron. The local gradients are then used to perform each weight update.

In an RRAM-based synaptic device, synaptic weight is implemented as the conductance of an RRAM cell or device, which is always a positive value. Back propagation algorithms used for machine learning (e.g., stochastic gradient descent (SGD), etc.), however, require weights to have both positive and negative values. Further, the conductance of an RRAM cell or RRAM synaptic device can have large device-to-device variation, which can affect neural network performance.

Illustrative embodiments overcome these and other disadvantages by providing a differential RPU unit cell, in which the weight is presented as the differential conductance of two analog memory elements (e.g., RRAM cells or devices). Therefore, negative weight values are naturally implemented in the hardware of the differential RPU unit cell. Further, some embodiments utilize two physically close analog memory elements (e.g., RRAM devices) in one differential RPU unit cell, thus minimizing device-to-device variation. Differential updating in some embodiments achieves double the updating signal, thereby improving a signal-to-noise ratio. Differential updating can also double the number of states, where a state is a distinguishable weight value.

FIG. 1 depicts a circuit diagram 100 of a differential RPU unit cell where the analog memory elements are implemented as a first RRAM device 102 and a second RRAM device 104. More generally, the first RRAM device 102 and second RRAM device 104 may be implemented as other types of analog memory elements, such as memristor devices whose conductance can be changed gradually in both directions and has a threshold voltage. The first RRAM device 102 and the second RRAM device 104 have polarity, as indicated by the fill of such elements in FIG. 1. Similar fill is used to denote polarity of RRAM devices in other figures. The first RRAM device 102 has a resistance R1 and conductance g1, and the second RRAM device 104 has a resistance R2 and conductance g2. The RRAM RPU unit cell of FIG. 1 also includes two pass transistors 106 and 108, and six terminals denoted 101a, 101b, 103, 105, 107 and 109. The terminal 105 corresponds to a read column line, while the terminal 107 corresponds to a read row line.

Figure 2:
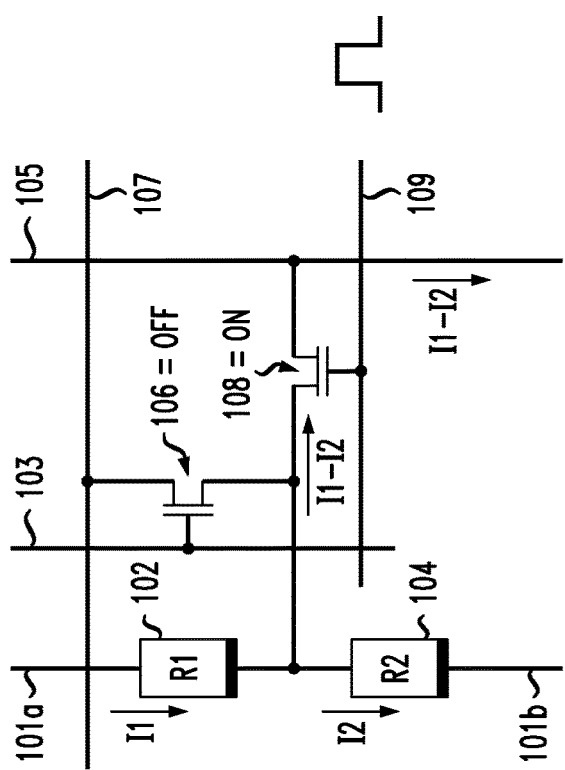
FIG. 2 depicts a forward pass operation in the FIG. 1 RRAM RPU unit cell, according to an embodiment of the present invention.

FIG. 2 depicts a circuit diagram 200 of the FIG. 1 RRAM RPU unit cell during a forward pass operation. The table 202 of FIG. 2 indicates the voltages at the terminals 101a, 101b, 103, 105, 107 and 109 during the forward pass. During forward pass, there is a voltage difference, denoted Vr, across the RRAM devices 102 and 104 via voltage Vr applied to terminal 101a and a voltage of 0 applied to terminal 101b. The value of Vr is smaller than a threshold voltage (Vt) of the RRAM devices 102 and 104. In this context, the threshold voltage is defined as the minimum voltage across an RRAM device (e.g., RRAM devices 102 and 104) that could cause the conductance of the RRAM device to change. The pass transistor 106 is turned off as the voltage applied on terminal 103 is 0, or more generally a voltage that is lower than the threshold voltage (Vt) of the pass transistor 106. The pass transistor 108 is turned on by read pulse voltages applied to terminal 109. The terminal 105 is at a fixed voltage of ½ Vr, and therefore the terminal between RRAM device 102 and RRAM device 104 is also at ½ Vr. The fixed voltage of ½ Vr is applied to terminal 105, regardless of the conductance of the RRAM devices 102 and 104. The differential current through the RRAM devices 102 and 104 is collected on the line 105. The current collected on line 105 is:

$$I = I1 - I2 = \frac{1}{2} Vr(g1 - g2) \quad (1)$$

The sign of the synaptic weight for the FIG. 1 RRAM RPU unit cell is determined by the sign of the difference in conductance between the RRAM devices 102 and 104 (e.g., g1-g2). The differential current I is integrated by a current integrator (not shown in FIG. 2).

Figure 3:
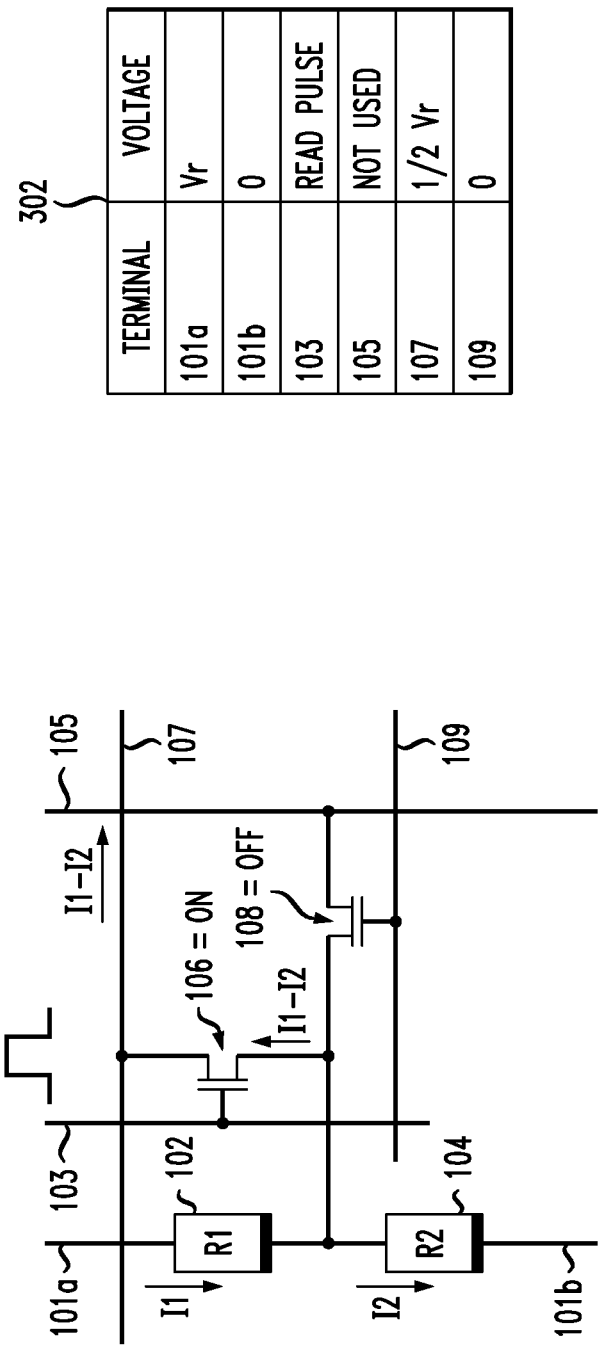
FIG. 3 depicts a backward pass operation in the FIG. 1 RRAM RPU unit cell, according to an embodiment of the present invention.

FIG. 3 depicts a circuit diagram 300 of the FIG. 1 RRAM RPU unit cell during a backward pass operation. The table 302 of FIG. 3 indicates the voltages at the terminals 101a, 101b, 103, 105, 107 and 109 during the backward pass. During the backward pass, there is a voltage difference Vr across the RRAM devices 102 and 104 via voltage Vr applied to terminal 101a and a voltage of 0 applied to terminal 101b. The pass transistor 106 is turned on by read pulse voltages applied to terminal 103. The pass transistor 108 is turned off as the voltage applied to terminal 109 is 0, or more generally a voltage that is lower than the Vt of the pass transistor 108. The terminal 107 is at a fixed voltage ½ Vr, and therefore the terminal between RRAM devices 102 and 104 is at ½ Vr. The differential current through the RRAM devices 102 and 104 is collected on the line 107. The current collected on line 107 is determined in accordance with the equation (1) above, and the sign of the synaptic weight for the FIG. 1 RRAM RPU unit cell is determined by the sign of the difference in conductance between the RRAM devices 102 and 104 (e.g., g1-g2). The differential current is integrated by a current integrator (not shown in FIG. 3).

Figure 4:
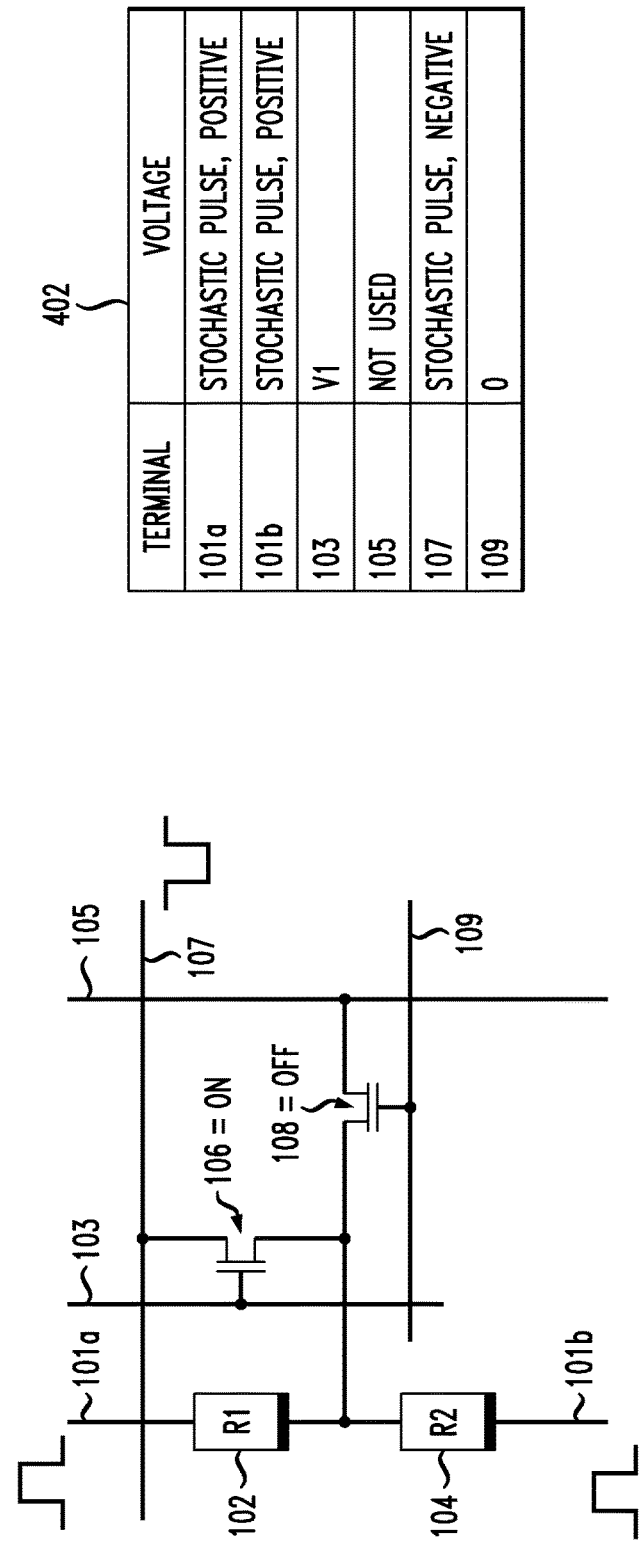
FIG. 4 depicts a positive weight update in the FIG. 1 RRAM RPU unit cell, according to an embodiment of the present invention.

FIG. 4 depicts a circuit diagram 400 of the FIG. 1 RRAM RPU unit cell during a positive weight update operation (e.g., where a value of the conductance g1 is increased and a value of the conductance g2 is decreased). The table 402 of FIG. 4 indicates the voltages at the terminals 101a, 101b, 103, 105, 107 and 109 during the positive weight update. During the positive weight update, the conductance g1 of RRAM device 102 is increased and the conductance g2 of RRAM device 104 is decreased. The pass transistor 106 is turned partially on by a voltage V1 applied to terminal 103. By turning the pass transistor 106 partially on, a compliance of the updating current is set which prevents the RRAM devices 102 and 104 from being over programmed. The pass transistor 108 is turned off as the voltage applied to terminal 109 is 0, or more generally a voltage that is lower than the Vt of the pass transistor 108.

Synchronized stochastic positive pulses are applied to terminals 101a and 101b. The stochastic positive pulses are synchronized such that there is no voltage difference across the RRAM devices 102 and 104 by the voltages applied to terminals 101a and 101b. If the pass transistor 106 is on (e.g., at least partially) while the pass transistor 108 is off, a reverse polarity pulse (e.g., a negative stochastic pulse) applied to terminal 107 that arrives as the same time as the stochastic positive pulses on terminals 101a and 101b causes the values R1 and R2 (e.g., g1 and g2) to update. In other words, when the stochastic positive pulses applied to terminals 101a and 101b are coincident with the stochastic negative pulse applied to terminal 107, the voltage across RRAM devices 102 and 104 is above a threshold voltage and a successful weight update is achieved for the RRAM devices 102 and 104 simultaneously. Since the voltage across RRAM devices 102 and 104 has reversed polarity, as g1 increases g2 decreases. If the stochastic positive pulses applied to terminals 101a and 101b and the stochastic negative pulse applied to terminal 107 are not coincident, there is no weight update for the RRAM devices 102 and 104.

Figure 5:
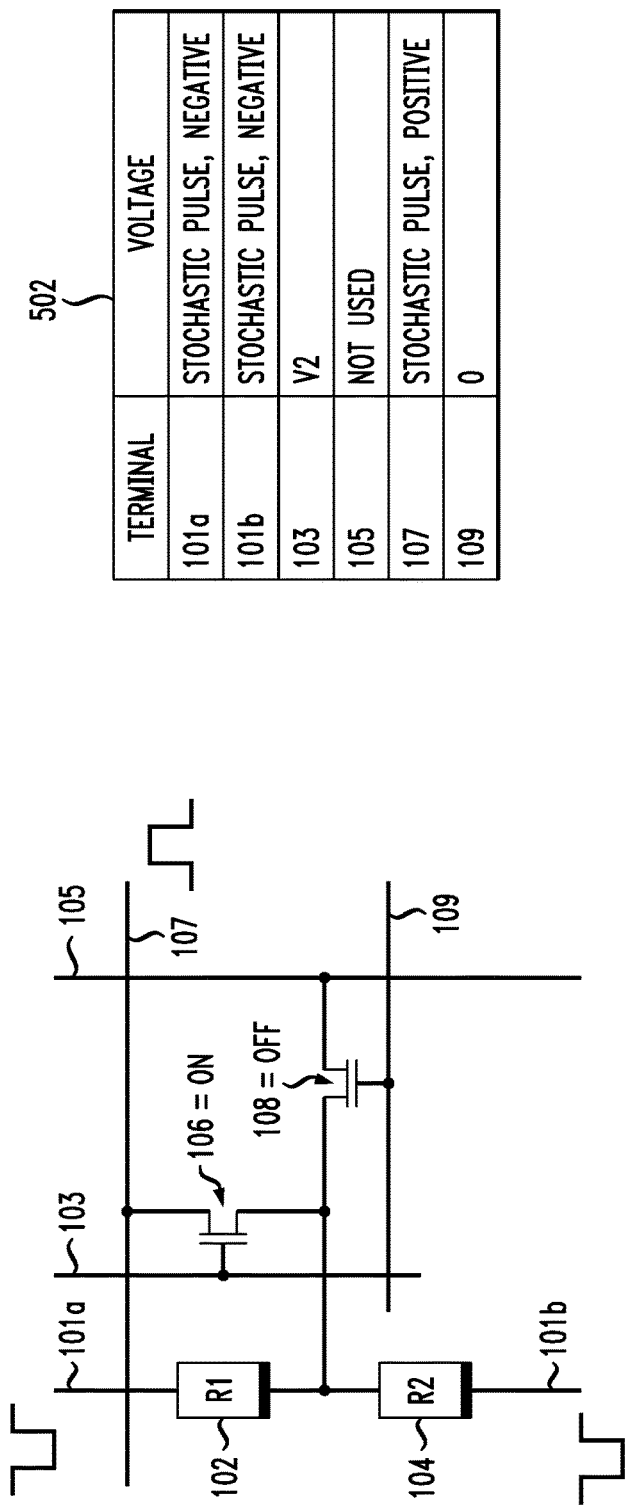
FIG. 5 depicts a negative weight update in the FIG. 1 RRAM RPU unit cell, according to an embodiment of the present invention.

FIG. 5 depicts a circuit diagram 500 of the FIG. 1 RRAM RPU unit cell during a negative weight update operation (e.g., where a value of the conductance g1 is decreased and the value of the conductance g2 is increased). The table 502 of FIG. 5 indicates the voltages at the terminals 101a, 101b, 103, 105, 107 and 109 during the negative weight update. During the negative weight update, the conductance g1 of RRAM device 102 is decreased and the conductance g2 of RRAM device 104 is increased. Similar to the positive weight update described above with respect to FIG. 4, during the negative weight update the pass transistor 106 is turned partially on by a voltage V2 applied to terminal 103. The voltages V1 and V2 may be the same or different. This sets a compliance of the updating current to prevent the RRAM devices 102 and 104 from being over programmed. The pass transistor 108 is turned off as the voltage applied to terminal 109 is 0, or more generally a voltage that is lower than the Vt of the pass transistor 108.

Synchronized stochastic negative pulses are applied to terminals 101a and 101b. The stochastic negative pulses are synchronized such that there is no voltage difference across the RRAM devices 102 and 104 by the voltages applied to terminals 101a and 101b. If the pass transistor 106 is on (e.g., at least partially) while the pass transistor 108 is off, a reverse polarity pulse (e.g., a positive stochastic pulse) applied to terminal 107 that arrives as the same time as the stochastic negative pulses on terminals 101a and 101b causes the values R1 and R2 (e.g., g1 and g2) to update. In other words, when the stochastic negative pulses applied to terminals 101a and 101b are coincident with the stochastic positive pulse applied to terminal 107, the voltage across RRAM devices 102 and 104 is above a threshold voltage and a successful negative weight update is achieved for the RRAM devices 102 and 104 simultaneously. Since the voltage across RRAM devices 102 and 104 has reversed polarity, as g1 decreases g2 increases. If the stochastic negative pulses applied to terminals 101a and 101b and the stochastic positive pulse applied to terminal 107 are not coincident, there is no weight update for the RRAM devices 102 and 104.

For the positive and negative weight update operations described above with respect to FIGS. 4 and 5, the number of coincident pulses (e.g., of the voltages applied to terminals 101a, 101b and 107) controls the change in value of g1 and g2 for the RRAM devices 102 and 104, respectively.

Figure 6:
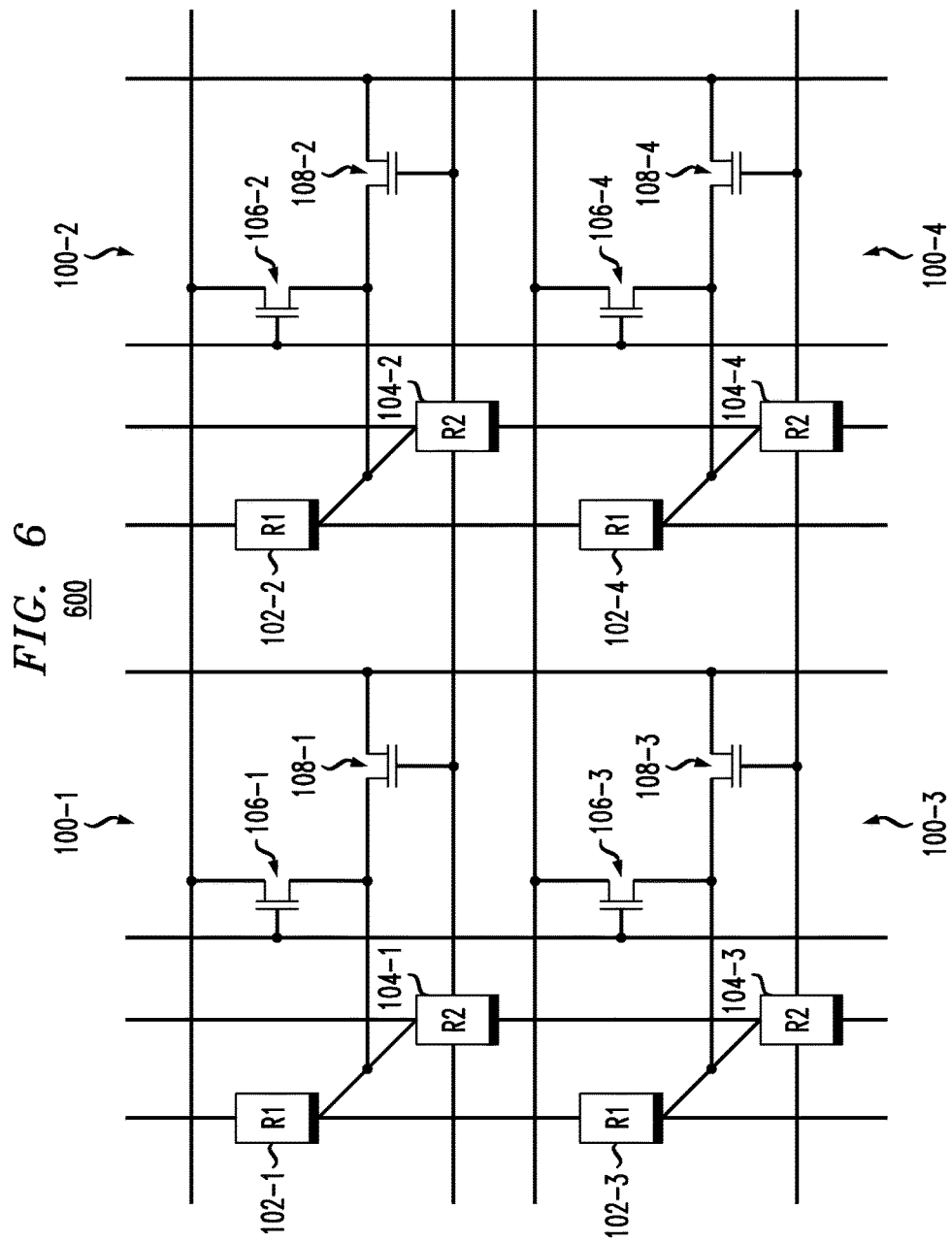
FIG. 6 depicts an array of the FIG. 1 RRAM RPU unit cells, according to en embodiment of the present invention.

The RRAM RPU unit cell 100 of FIG. 1 may be part of an array of RRAM RPU unit cells, such as the 2×2 array shown in the circuit diagram 600 of FIG. 6. FIG. 6 shows four instances of the FIG. 1 RRAM RPU unit cell (denoted 100-1, 100-2, 100-3 and 100-4) each having two RRAM devices (e.g., 102-1 and 104-1 for RRAM RPU unit cell 100-1, 102-2 and 104-2 for RRAM RPU unit cell 100-2, 102-3 and 104-3 for RRAM RPU unit cell 100-3, and 102-4 and 104-4 for RAM RPU unit cell 100-4) and two pass transistors (e.g., 106-1 and 108-1 for RRAM RPU unit cell 100-1, 106-2 and 108-2 for RRAM RPU unit cell 100-2, 106-3 and 108-3 for RRAM RPU unit cell 100-3, and 106-4 and 108-4 for RRAM RPU unit cell 100-4). While FIG. 6 shows a 2×2 array of RRAM RPU unit cells, any suitable N×M array of RPU unit cells may be constructed as desired, where N and M are each integers 1 or greater.

Figure 7:
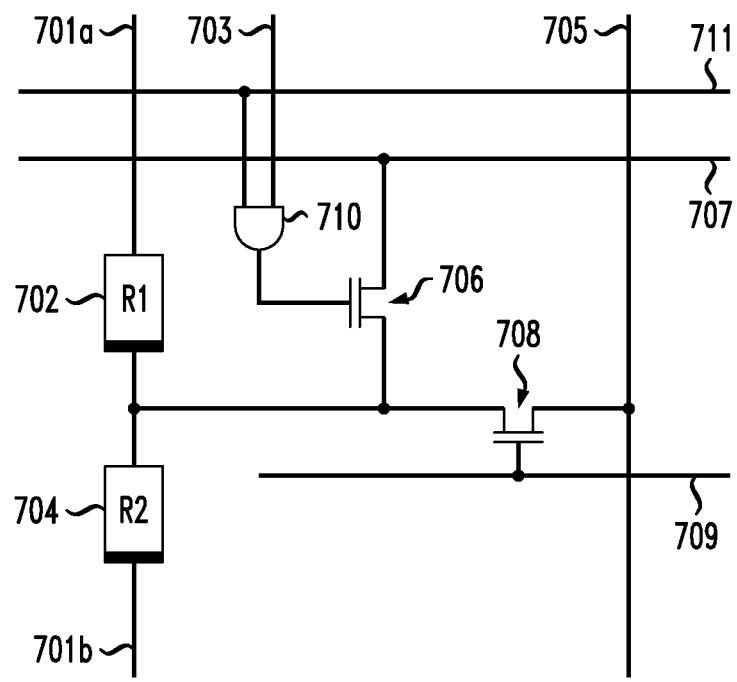
FIG. 7 depicts a circuit diagram of another differential RRAM RPU unit cell, according to an embodiment of the present invention.

FIG. 7 shows a circuit diagram 700 of another example of an RRAM RPU unit cell. The FIG. 7 RRAM RPU unit cell, similar to the FIG. 1 RRAM RPU unit cell, includes two RRAM devices 702 and 704 (having respective resistances R1 and R2 and respective conductances g1 and g2) and two pass transistors 706 and 708. The FIG. 7 RRAM RPU unit cell further includes an AND logic gate 710. The FIG. 7 RRAM RPU unit cell has terminals 701a, 701b, 703, 705, 707, 709 and 711. The terminal 705 corresponds to a read column line, while the terminal 707 corresponds to a read row line.

Compared with the RRAM RPU unit cell of FIG. 1, the FIG. 7 RRAM RPU unit cell may provide advantages in easier fabrication and operation. For example, during positive and negative weight updates which will be described in further detail below with respect to FIGS. 10 and 11, the FIG. 7 RRAM RPU unit cell does not require synchronization of pulses applied to terminals 701a and 701b. Instead, during positive and negative weight updates the terminals 701a and 701b may be held at fixed voltages.

Figure 8:
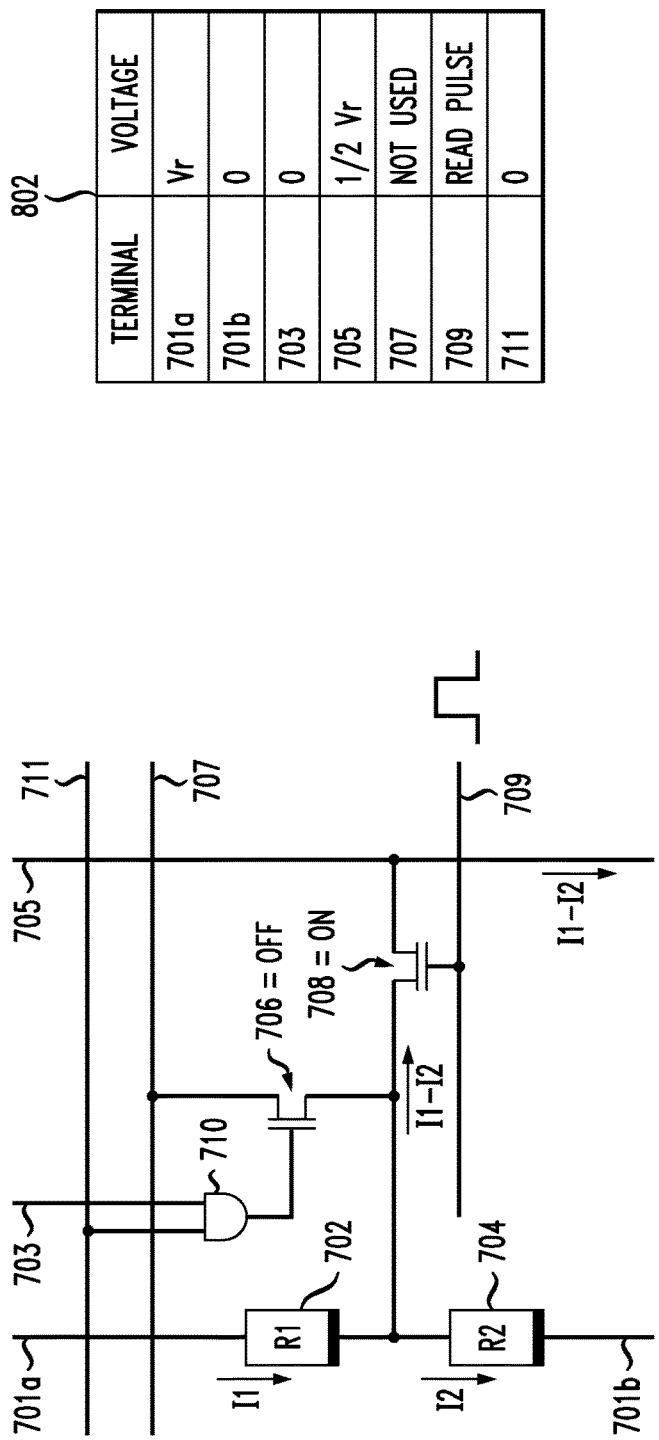
FIG. 8 depicts a forward pass operation in the FIG. 7 RRAM RPU unit cell, according to an embodiment of the present invention.

FIG. 8 depicts a circuit diagram 800 of the FIG. 7 RRAM RPU unit cell during a forward pass operation. The table 802 of FIG. 8 indicates the voltages at the terminals 701a, 701b, 703, 705, 707, 709 and 711 during the forward pass. During the forward pass, there is a voltage difference Vr across the RRAM devices 702 and 704 via a voltage Vr applied to terminal 701a and a voltage of 0 applied to terminal 701b. The value of Vr is smaller than a Vt of the RRAM devices 702 and 704. The pass transistor 706 is turned off as the voltage applied on terminals 703 and 711 is 0, and thus the output of AND logic gate 710 is also low or 0. The pass transistor 708 is turned on by read pulse voltages applied to terminal 709. The terminal 705 is at a fixed voltage of ½ Vr, and therefore the terminal between RRAM devices 702 and RRAM device 704 is also at ½ Vr. The differential current through the RRAM devices 702 and 704 is collected on line 705. The current collected on line 705 is determined in accordance with equation (1) described above. The sign of the synaptic weight for the FIG. 7 RRAM RPU unit cell is determined by the sign of the difference in conductance between the RRAM devices 702 and 704 (e.g., g1-g2). The differential current is integrated by a current integrator (not shown in FIG. 8).

Figure 9:
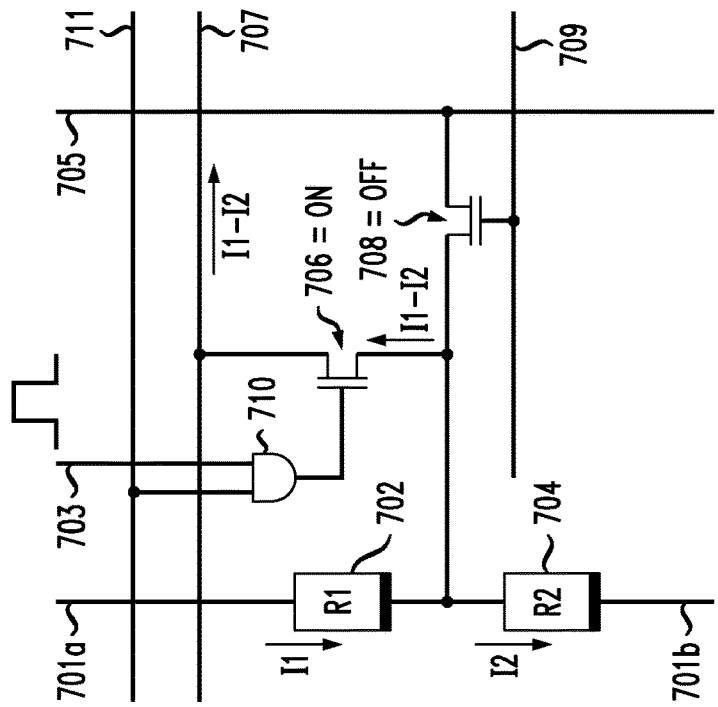
FIG. 9 depicts a backward pass operation in the FIG. 7 RRAM RPU unit cell, according to an embodiment of the present invention.

FIG. 9 depicts a circuit diagram 900 of the FIG. 7 RRAM RPU unit cell during a backward pass operation. The table 902 of FIG. 9 indicates the voltages at the terminals 701a, 701b, 703, 705, 707, 709 and 711 during the backward pass. During the backward pass, there is a voltage difference Vr across the RRAM devices 702 and 704 via voltage Vr applied to terminal 701a and a voltage of 0 applied to terminal 701b. The pass transistor 706 is turned on by read pulse voltages applied to terminal 703. The pass transistor 708 is turned off as the voltage applied to terminal 709 is 0, or more generally a voltage that is lower than the Vt of the pass transistor 706. Terminal 707 is at a fixed voltage ½ Vr, and therefore the terminal between RRAM devices 702 and 704 is at ½ Vr. The differential current through the RRAM devices 702 and 704 is collected on line 707. The current collected on line 707 is determined in accordance with equation (1) above. The sign of the synaptic weight for the FIG. 7 RRAM RPU unit cell is determined by the sign of the difference in conductance between the RRAM devices 702 and 704 (e.g., g1-g2). The differential current is integrated by a current integrator (not shown in FIG. 9).

Figure 10:
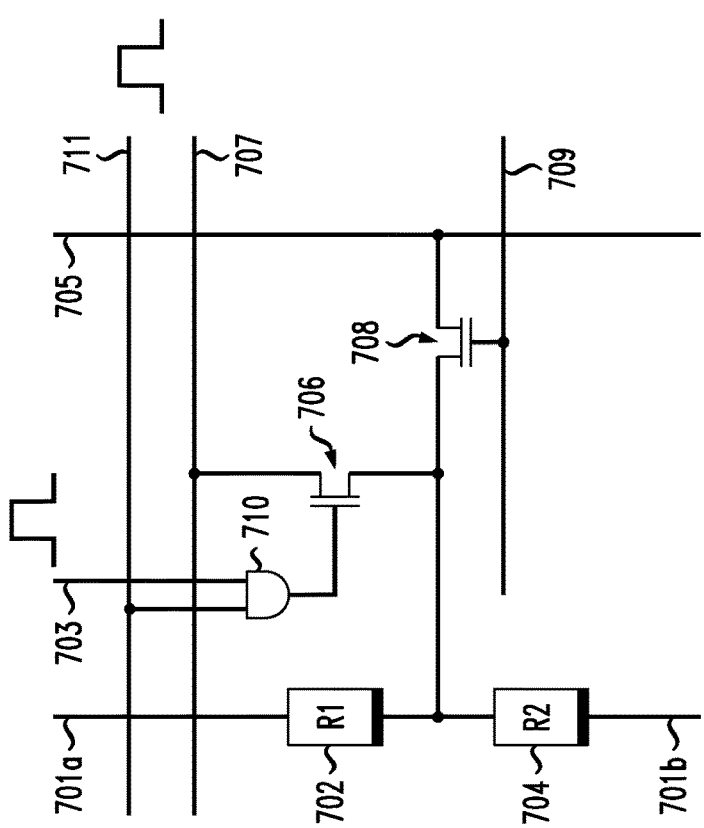
FIG. 10 depicts a positive weight update in the FIG. 7 RRAM RPU unit cell, according to an embodiment of the present invention.

FIG. 10 depicts a circuit diagram 1000 of the FIG. 7 RRAM RPU unit cell during a positive weight update operation (e.g., where a value of the conductance g1 is increased and a value of the conductance g2 is decreased). The table 1002 of FIG. 10 indicates the voltages applied at the terminals 701a, 701b, 703, 705, 707, 709 and 711 during the positive weight update. During the positive weight update, the conductance g1 of RRAM device 702 is increased and the conductance g2 of RRAM device 704 is decreased. During the positive weight update, a constant "high" voltage is applied to terminals 701a and 701b. A constant "low" voltage is applied to terminal 707. In this context, "high" and "low" voltages refer to voltages that are above and below the Vt of RRAM devices 702 and 704.

A digital stochastic pulse is applied to terminals 703 and 711. When the pulses on terminals 703 and 711 are coincident, the AND logic gate 710 outputs Vdd turning on the pass transistor 706. Once pass transistor 706 is on, the voltage of the shared terminal between RRAM devices 702 and 704 will be equal to the voltage of 707, and there will be a voltage difference across the RRAM devices 702 and 704. This voltage is larger than the threshold voltage of RRAM devices 702 and 704, and will thus cause a successful positive weight update (e.g., increasing g1 and decreasing g2). The Vdd of the AND logic gate 710 may be an analog voltage that partially turns on the pass transistor 706, similar to the positive weight update described above with respect to FIG. 4. When the pulses on terminals 703 and 711 are not coincident, the AND logic gate 710 outputs low or zero and the pass transistor 706 remains off such that no weight update takes place.

Figure 11:
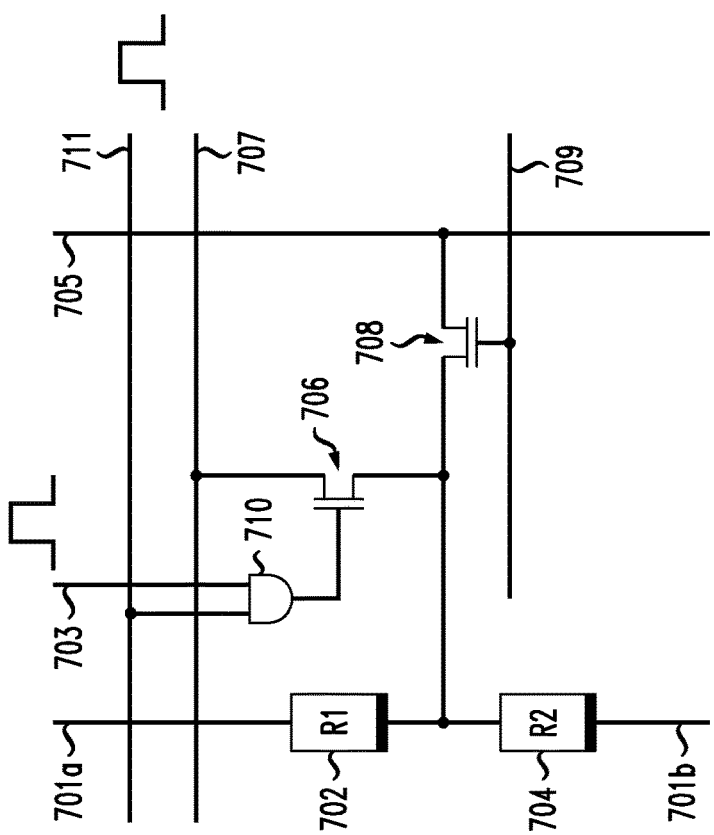
FIG. 11 depicts a negative weight update in the FIG. 7 RRAM RPU unit cell, according to an embodiment of the present invention.

FIG. 11 depicts a circuit diagram 1100 of the FIG. 7 RRAM RPU unit cell during a negative weight update operation (e.g., where a value of the conductance g1 is decreased and the value of the conductance g2 is increased). The table 1102 of FIG. 11 indicates the voltages applied to the terminals 701a, 701b, 703, 705, 707, 709 and 711 during the negative weight update. During the negative weight update, the conductance g1 of RRAM device 702 is decreased and the conductance g2 of RRAM device 704 is increased. During the negative weight update, a constant low voltage is applied to terminals 701a and 701b. A constant high voltage is applied to terminal 707. A digital stochastic pulse is applied to terminals 703 and 711. When the pulses on terminals 703 and 711 are coincident, the AND logic gate 710 outputs Vdd turning on the pass transistor 706. Once pass transistor 706 is on, the voltage of the shared terminal between RRAM devices 702 and 704 will be equal to the voltage of 707, and there will be a voltage difference across RRAM devices 702 and 704. This voltage is larger than the threshold voltage of RRAM devices 702 and 704 and will thus cause a successful negative weight update (e.g., decreasing g1 and increasing g2). The Vdd of the AND logic gate 710 may be an analog voltage that partially turns on the pass transistor 706, similar to the negative weight update described above with respect to FIG. 5. When the pulses on terminals 703 and 711 are not coincident, the AND logic gate 710 outputs low or zero and the pass transistor 706 remains off such that no weight update takes place.

For the positive and negative weight update operations described above with respect to FIGS. 10 and 11, the number of coincident pulses (e.g., of the voltages applied to terminals 703 and 711) controls the change in value of g1 and g2 for RRAM devices 702 and 704, respectively.

Although not shown, the FIG. 7 RRAM RPU unit cell may be part of an N×M array of RRAM RPU unit cells similar to the array of FIG. 1 RRAM RPU unit cells shown in the FIG. 6 array.

Figure 12:
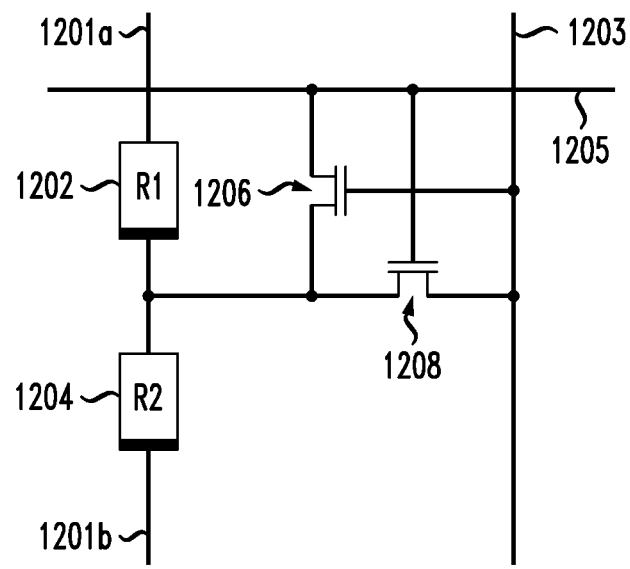
FIG. 12 depicts a circuit diagram of another differential RRAM RPU unit cell, according to an embodiment of the present invention.

FIG. 12 depicts a circuit diagram 1200 of an RRAM RPU unit cell. The FIG. 12 RRAM RPU unit cell is similar to that of the FIG. 1 RRAM RPU unit cell, although there are fewer control lines for simplified operation. The FIG. 12 RRAM RPU unit cell includes RRAM devices 1202 and 1204 (having respective resistances R1 and R2 and respective conductances g1 and g2) and pass transistors 1206 and 1208. The FIG. 12 RRAM RPU unit cell also includes terminals 1201a, 1201b, 1203 and 1205. The terminal 1203 corresponds to a read column line, while the terminal 1205 corresponds to a read row line.

Figure 13:
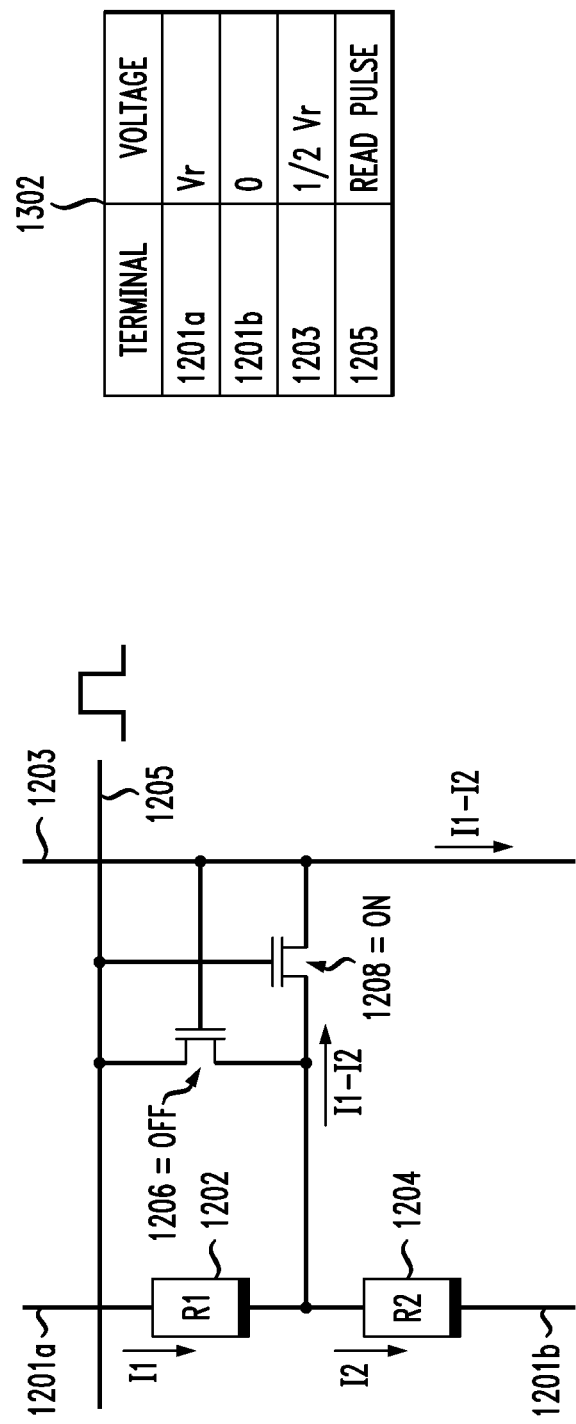
FIG. 13 depicts a forward pass operation in the FIG. 12 RRAM RPU unit cell, according to an embodiment of the present invention.

FIG. 13 depicts a circuit diagram 1300 of the FIG. 12 RRAM RPU unit cell during a forward pass operation. The table 1302 of FIG. 13 indicates the voltages at the terminals 1201a, 1201b, 1203 and 1205 during the forward pass. During the forward pass, there is a voltage difference Vr across the RRAM devices 1202 and 1204 via voltage Vr applied to terminal 1201a and a voltage of 0 applied to terminal 1201b. The value of Vr is smaller than a Vt of the RRAM device 1202. The pass transistor 1206 is turned off, as the voltage ½ Vr at the terminal 1203 is below a Vt of the pass transistor 1206. The pass transistor 1208 is turned on by read pulse voltages applied to the terminal 1205. Once pass transistor 1208 is on, the terminal between the RRAM device 1202 and 1204 is at ½ Vr. When the read pulse voltage applied to terminal 1205 is high and the pass transistor 1208 is turned on, the differential current through the RRAM devices 1202 and 1204 is collected on line 1203. The current collected on line 1203 is determined in accordance with equation (1). The sign of the synaptic weight for the FIG. 12 RRAM RPU unit cell is determined by the sign of the difference in conductance between the RRAM devices 1202 and 1204 (e.g., g1-g2). The differential current I is integrated by a current integrator (not shown in FIG. 13).

Figure 14:
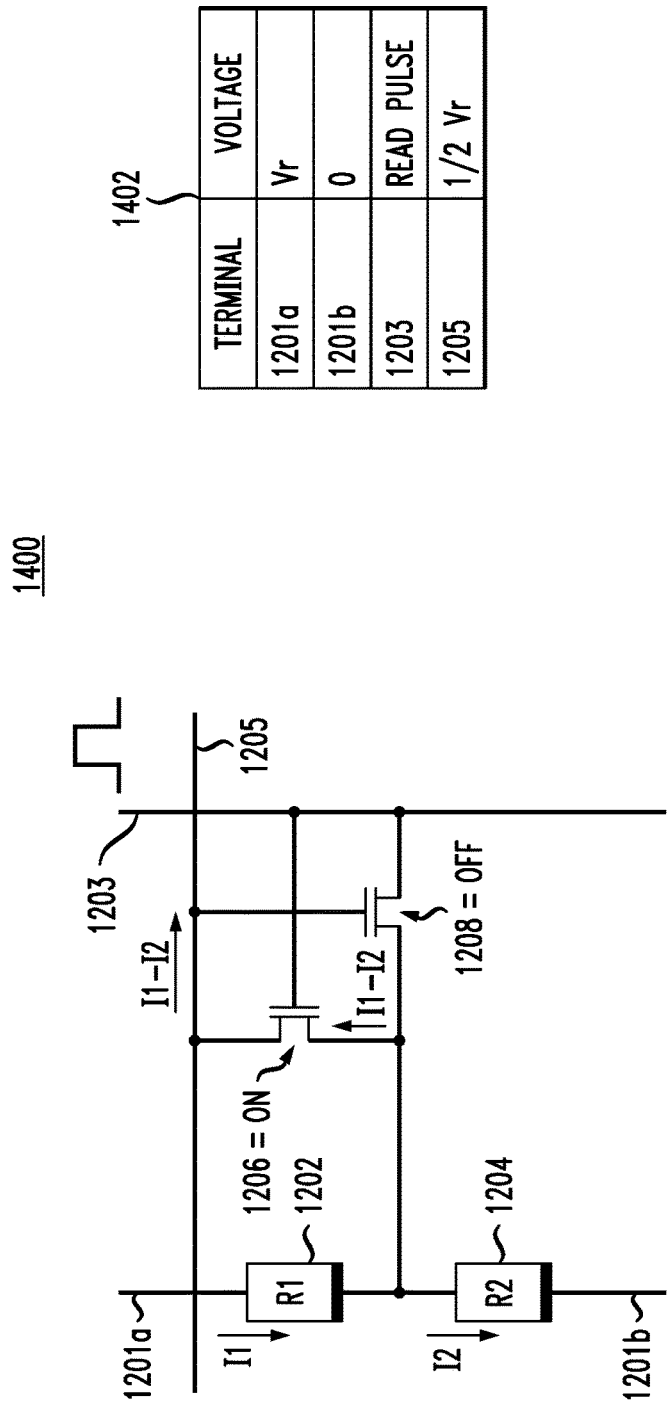
FIG. 14 depicts a backward pass operation in the FIG. 12 RRAM RPU unit cell, according to an embodiment of the present invention.

FIG. 14 depicts a circuit diagram 1400 of the FIG. 12 RRAM RPU unit cell during a backward pass operation. The table 1402 of FIG. 14 indicates the voltages at the terminals 1201a, 1201b, 1203 and 1205 during the backward pass. During the backward pass, there is a voltage difference Vr across the RRAM devices 1202 and 1204 via voltage Vr applied to terminal 1201a and a voltage of 0 applied to terminal 1201b. The pass transistor 1208 is turned off, as the voltage ½ Vr applied to terminal 1205 is below a Vt of the pass transistor 1208. The pass transistor 1206 is turned on by read pulse voltages applied to the terminal 1203. Once pass transistor 1206 is on, the terminal between the RRAM device 1202 and 1204 is at ½ Vr. When the read pulse voltage applied to terminal 1203 is high and the pass transistor 1206 is turned on, the differential current through the RRAM devices 1202 and 1204 is collected on line 1205. The current collected on line 1205 is determined in accordance with equation (1). The sign of the synaptic weight for the FIG. 12 RRAM RPU unit cell is determined by the sign of the difference in conductance between the RRAM devices 1202 and 1204 (e.g., g1-g2). The differential current I is integrated by a current integrator (not shown in FIG. 14).

Compared with the positive and negate weight update for the FIG. 1 RRAM RPU unit cell described above with respect to FIGS. 4 and 5 where voltage pulses are applied to the drain side of the pass transistors 106 and 108, the positive and negative weight updates for the FIG. 12 RRAM RPU unit cell applies voltage pulses to the gates of the pass transistors 1206 and 1208 as will now be described with respect to FIGS. 15 and 16.

Figure 15:
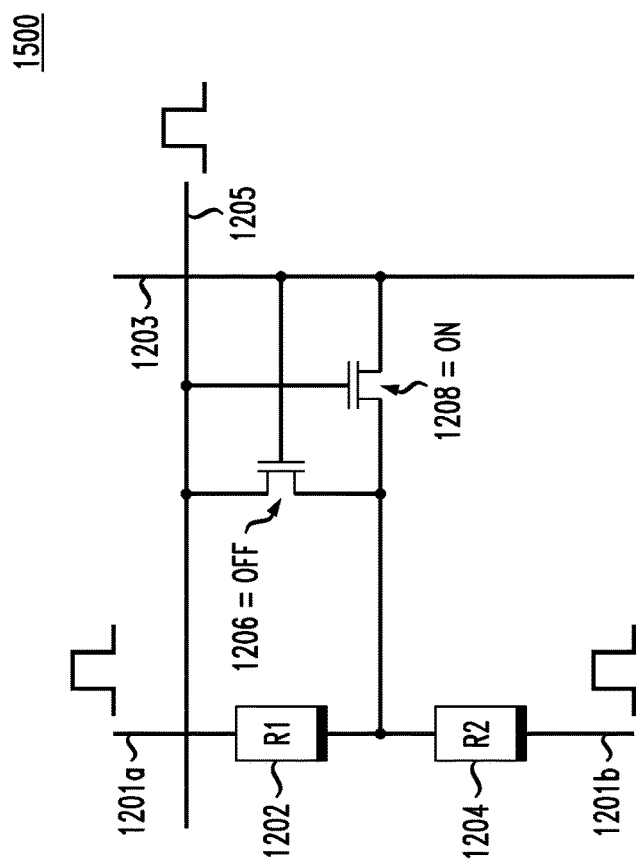
FIG. 15 depicts a positive weight update in the FIG. 12 RRAM RPU unit cell, according to an embodiment of the present invention.

FIG. 15 depicts a circuit diagram 1500 of the FIG. 12 RRAM RPU unit cell during a positive weight update operation (e.g., where a value of the conductance g1 is increased and a value of the conductance g2 is decreased). The table 1502 of FIG. 15 indicates the voltages at the terminals 1201a, 1201b, 1203 and 1205 during the positive weight update. During the positive weight update, the conductance g1 of RRAM device 1202 is increased and the conductance g2 of RRAM device 1204 is decreased. During the positive weight update, the pass transistor 1206 is turned off as the voltage applied to terminal 1203 is 0. Stochastic positive voltage pulses are applied to terminals 1201a, 1201b and 1205. When high, the stochastic pulse applied to terminal 1205 turns on the pass transistor 1208 and the voltage of the terminal between RRAM devices 1202 and 1204 is at fixed voltage equal to the voltage on 1203. Pulses on 1201a and 1201b will cause a positive weight update on both RRAM devices 1202 and 1204 (e.g., g1 increases and g2 decreases).

Figure 16:
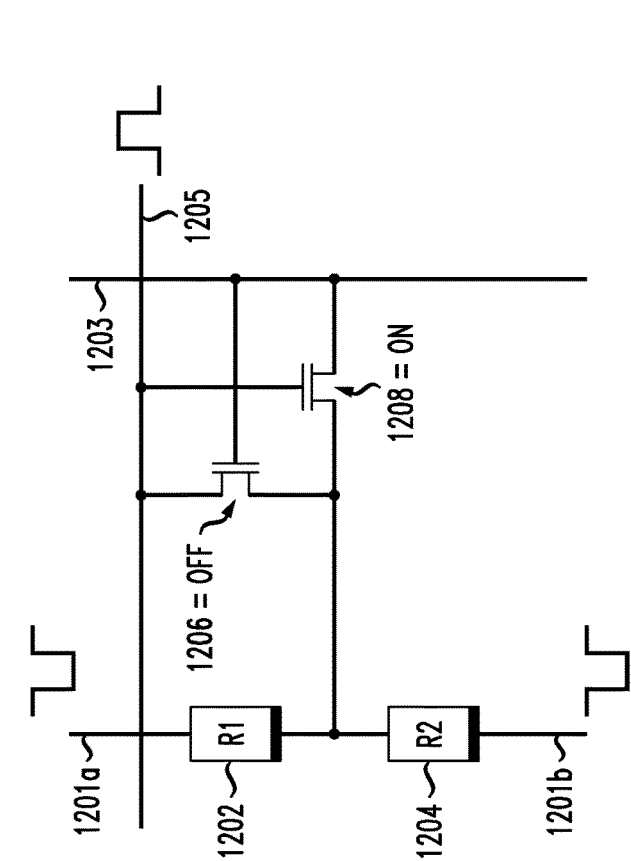
FIG. 16 depicts a negative weight update in the FIG. 12 RRAM RPU unit cell, according to an embodiment of the present invention.

FIG. 16 depicts a circuit diagram 1600 of the FIG. 12 RRAM RPU unit cell during a negative weight update operation (e.g., where a value of the conductance g1 is decreased and a value of the conductance g2 is increased). The table 1602 of FIG. 16 indicates the voltages at the terminals 1201a, 1201b, 1203 and 1205 during the negative weight update. During the negative weight update, a stochastic positive voltage pulse is applied to terminal 1205, while stochastic negative voltage pulses are applied to terminals 1201a and 1201b. When high, the stochastic pulse applied to terminal 1205 turns on the pass transistor 1208 and the voltage of the terminal between RRAM devices 1202 and 1204 is at a fixed voltage equal to the voltage on 1203. Pulses on terminals 1201a and 1201b will cause a negative weight update on RRAM devices 1202 and 1204 (e.g., g1 decreases and g2 increases).

For the positive and negative weight update operations described above with respect to FIGS. 15 and 16, the number of coincident pulses (e.g., of the voltages applied to terminals 1201a, 1201b and 1205) controls the change in value of g1 and g2 for RRAM devices 1202 and 1204, respectively.

Although not shown, the FIG. 12 RRAM RPU unit cell may be part of an N×M array of RRAM RPU unit cells similar to the array of FIG. 1 RRAM RPU unit cells shown in the FIG. 6 array.

Figure 17:
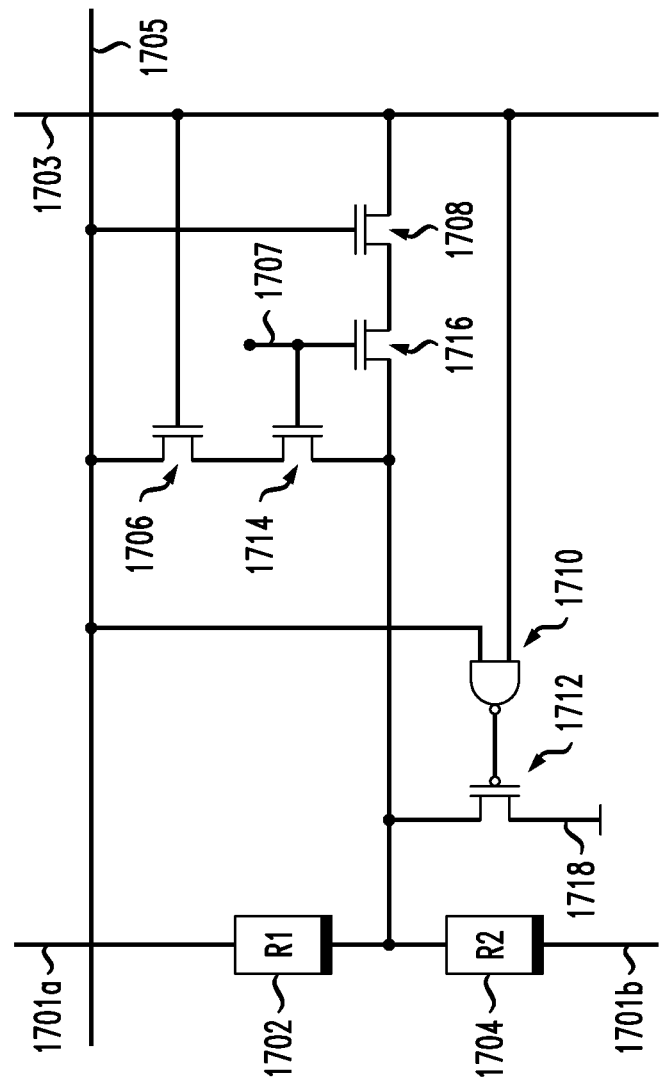
FIG. 17 depicts a circuit diagram of another differential RRAM RPU unit cell, according to an embodiment of the present invention.

FIG. 17 depicts a circuit diagram 1700 of an RRAM RPU unit cell. The FIG. 17 RRAM RPU unit cell is similar to that of the FIG. 7 RRAM RPU unit cell, although it uses a NAND logic gate rather than an AND logic gate and further includes an analog selector. The FIG. 17 RRAM RPU unit cell includes RRAM devices 1702 and 1704 (having respective resistances R1 and R2 and respective conductances g1 and g2) and pass transistors 1706 and 1708. The FIG. 17 RRAM RPU unit cell further includes NAND logic gate 1710 having an output coupled to PFET transistor 1712. The FIG. 17 RRAM RPU unit cell also includes an analog selector provided by a read enable terminal 1707 coupled to gates of read enable transistors 1714 and 1716. The FIG. 17 RRAM RPU unit cell includes terminals 1701a, 1701b, 1703, 1705, 1718 and 1707. The terminal 1703 corresponds to a read column line, while the terminal 1705 corresponds to a read row line.

Figure 18:
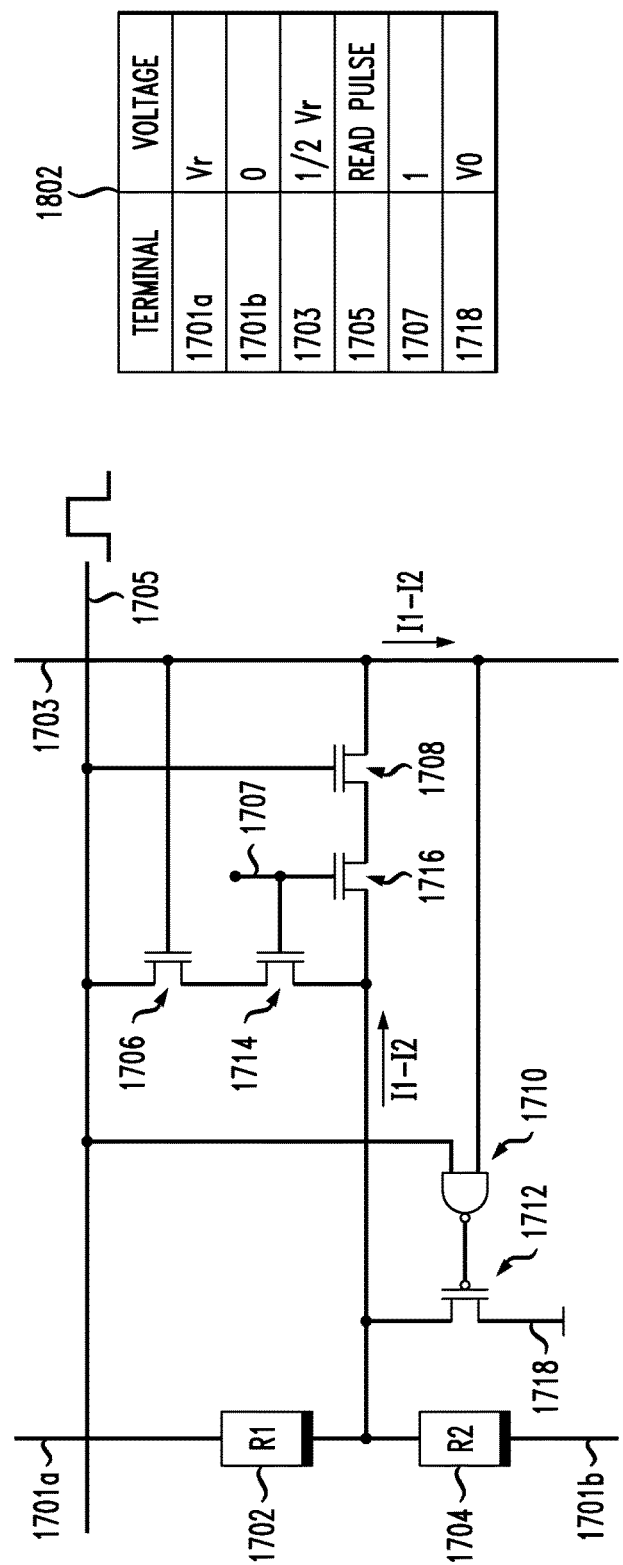
FIG. 18 depicts a forward pass operation in the FIG. 17 RRAM RPU unit cell, according to an embodiment of the present invention.

FIG. 18 depicts a circuit diagram 1800 of the FIG. 17 RRAM RPU unit cell during a forward pass operation. The table 1802 of FIG. 18 indicates the voltages at the terminals 1701a, 1701b, 1703, 1705, 1707 and 1718 during the forward pass. During the forward pass, there is a voltage difference Vr across the RRAM devices 1702 and 1704 via a voltage Vr applied to terminal 1701a and a voltage of 0 applied to terminal 1701b. The value of Vr is smaller than a Vt of the RRAM devices 1702 and 1704. The pass transistor 1706 is turned off as the fixed voltage ½ Vr at terminal 1703 is not sufficient to turn on the pass transistor 1706. The pass transistor 1708 is turned on by read pulse voltages applied to terminal 1705. A "high" or 1 voltage is applied to the read enable terminal 1707, which turns on the read enable transistors 1714 and 1716, where the "high" voltage in this context refers to a voltage above the Vt of read enable transistors 1714 and 1716. Since the terminal 1703 is at the fixed voltage ½ Vr and the transistors 1708 and 1716 are turned on, the terminal between the RRAM devices 1702 and 1704 is also at ½ Vr. The differential current through the RRAM devices 1702 and 1704 is collected on line 1703. The current collected on line 1703 is determined in accordance with equation (1) described above. The sign of the synaptic weight for the FIG. 17 RRAM RPU unit cell is determined by the sign of the different in conductance between the RRAM devices 1702 and 1704 (e.g., g1-g2). The differential current is integrated by a current integrator (not shown in FIG. 18).

Figure 19:
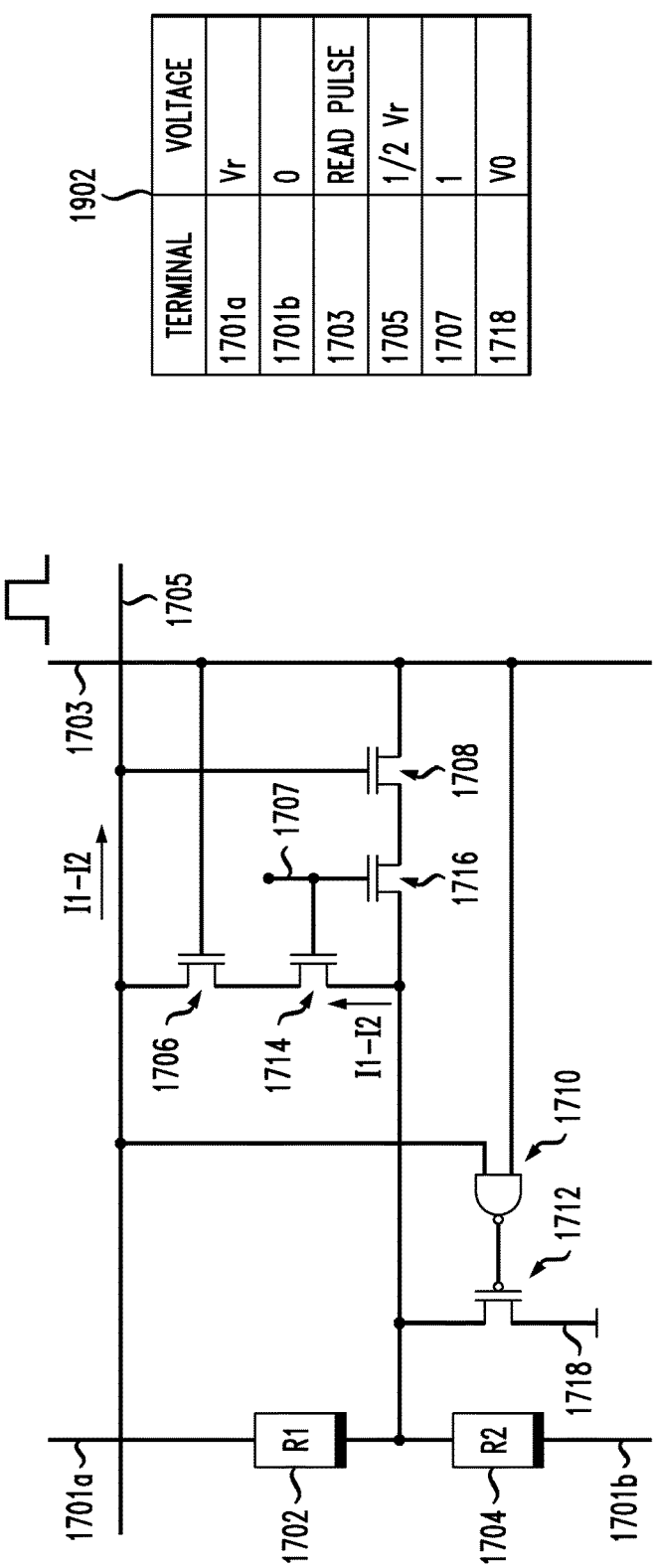
FIG. 19 depicts a backward pass operation in the FIG. 17 RRAM RPU unit cell, according to an embodiment of the present invention.

FIG. 19 depicts a circuit diagram 1900 of the FIG. 17 RRAM RPU unit cell during a backward pass operation. The table 1902 of FIG. 19 indicates the voltages at the terminals 1701a, 1701b, 1703, 1705, 1707 and 1718 during the backward pass. During the backward pass, there is a voltage difference Vr across the RRAM devices 1702 and 1704 via a voltage Vr applied to terminal 1701a and a voltage of 0 applied to terminal 1701b. The value of Vr is smaller than a Vt of the RRAM devices 1702 and 1704. The pass transistor 1708 is turned off as the fixed voltage of ½ Vr at terminal 1705 is not sufficient to turn on the pass transistor 1708. The pass transistor 1706 is turned on by read pulse voltages applied to terminal 1703. A high or 1 voltage is applied to the read enable terminal 1707, which turns on the transistors 1714 and 1716. Since the terminal 1705 is at the fixed voltage ½ Vr and the transistors 1706 and 1714 are turned on, the terminal between the RRAM devices 1702 and 1704 is also at ½ Vr. The differential current through the RRAM devices 1702 and 1704 is collected on line 1705. The current collected on line 1705 is determined in accordance with equation (1) described above. The sign of the synaptic weight for the FIG. 17 RRAM RPU unit cell is determined by the sign of the different in conductance between the RRAM devices 1702 and 1704 (e.g., g1-g2). The differential current is integrated by a current integrator (not shown in FIG. 18).

Figure 20:
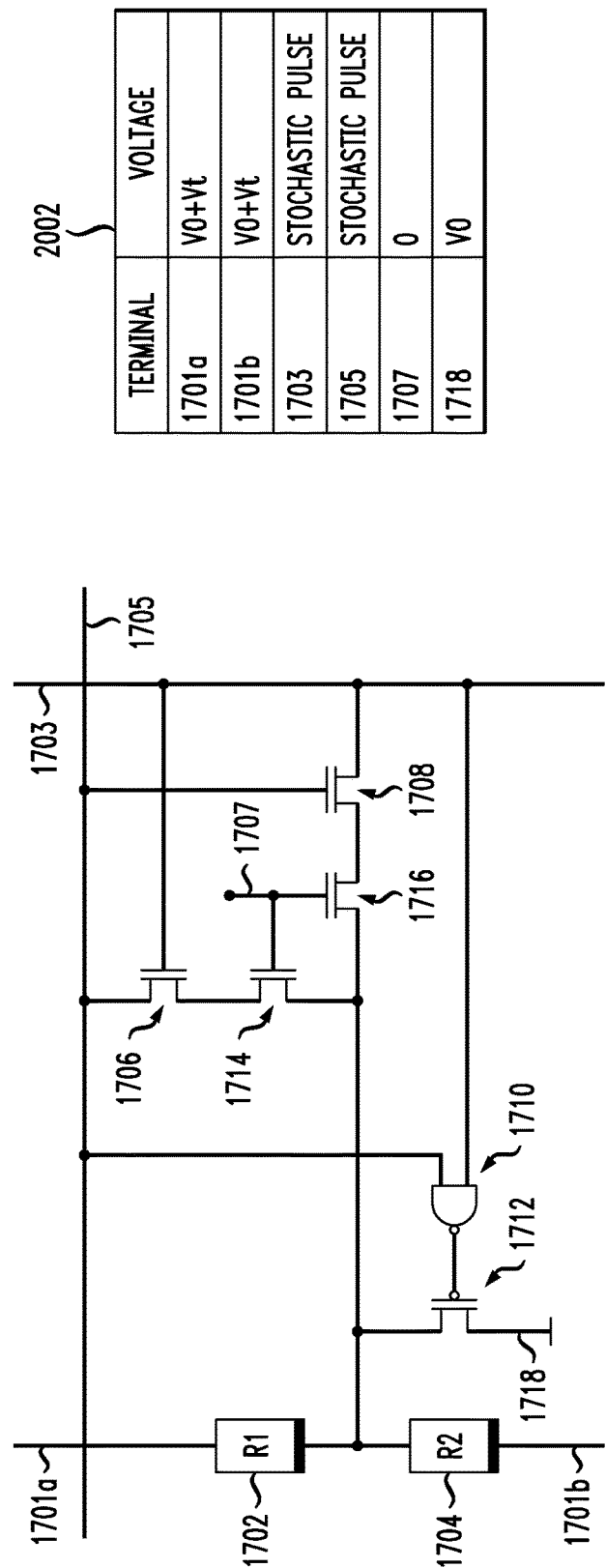
FIG. 20 depicts a positive weight update in the FIG. 17 RRAM RPU unit cell, according to an embodiment of the present invention.

FIG. 20 depicts a circuit diagram 2000 of the FIG. 17 RRAM RPU unit cell during a positive weight update operation (e.g., where a value of the conductance g1 is increased and a value of the conductance g2 is decreased). The table 2002 of FIG. 20 indicates the voltages at the terminals 1701a, 1701b, 1703, 1705, 1707 and 1718 during the positive weight update. During the positive weight update, the conductance g1 of RRAM device 1702 is increased and the conductance g2 of RRAM device 1704 is decreased. During the positive weight update, the read enable transistors 1714 and 1716 are turned off, as a voltage of 0 is applied to the read enable terminal 1707. A voltage of V0+Vt is applied to terminals 1701a and 1701b (e.g., a voltage that is V0 greater than the VT of the RRAM devices 1702 and 1704). Stochastic pulses are applied on terminals 1703 and 1705, and thus to input terminals of the NAND gate 1710. When the stochastic pulses applied to terminals 1703 and 1705 are coincident, the output of the NAND gate 1710 is low turning on PFET transistor 1712. A voltage V0 is applied to terminal 1718, and thus the terminal between the RRAM devices 1702 and 1704 is also at V0 providing a positive weight update due to the voltage difference across the RRAM devices 1702 and 1704 resulting from the voltage V0+Vt applied to terminals 1701a and 1701b.

Figure 21:
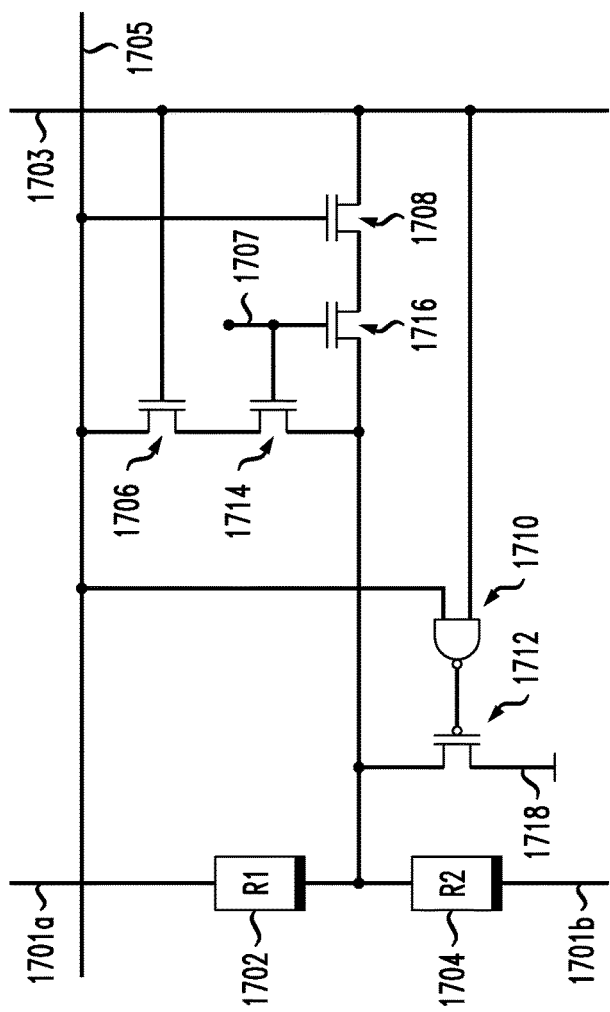
FIG. 21 depicts a negative weight update in the FIG. 17 RRAM RPU unit cell, according to an embodiment of the present invention.

FIG. 21 depicts a circuit diagram 2100 of the FIG. 17 RRAM RPU unit cell during a negative weight update operation (e.g., where a value of the conductance g1 is decreased and a value of the conductance g2 is increased). The table 2102 of FIG. 21 indicates the voltages at the terminals 1701a, 1701b, 1703, 1705, 1707 and 1718 during the negative weight update. During the negative weight update, the conductance g1 of RRAM device 1702 is increased and the conductance g2 of RRAM device 1704 is decreased. During the negative weight update, the read enable transistors 1714 and 1716 are turned off, as a voltage of 0 is applied to the read enable terminal 1707. A voltage of V0−Vt is applied to terminals 1701a and 1701b. Stochastic pulses are applied on terminals 1703 and 1705, and thus to input terminals of the NAND gate 1710. When the stochastic pulses applied to terminals 1703 and 1705 are coincident, the output of the NAND gate 1710 is low turning on PFET transistor 1712. A voltage V0 is applied to terminal 1718, and thus the terminal between the RRAM devices 1702 and 1704 is also at V0 providing a negative weight update due to the voltage difference across the RRAM devices 1702 and 1704 resulting from the voltage V0−Vt applied to terminals 1701a and 1701b.

Although not shown, the FIG. 17 RRAM RPU unit cell may be part of an N×M array of RRAM RPU unit cells similar to the array of FIG. 1 RRAM RPU unit cells shown in the FIG. 6 array.

In some embodiments, the pass transistors of the FIG. 1, FIG. 7, FIG. 12 and FIG. 17 RRAM RPU unit cells may be replaced with complementary metal-oxide-semiconductor (CMOS) transmissions gates. Since the input signals of the CMOS transmission gates are reversed, an extra inverter may be used for each CMOS transmission gate. In the FIG. 1, FIG. 7, FIG. 12 and FIG. 17 RRAM RPU unit cells, the pass transistors are shown as respective n-type channel field-effect transistors (NFETs) or p-type channel field-effect transistors (PFETs). It should be appreciated that instances of NFET and PFET transistors may be reversed in some embodiments, with suitable changes to the logic for applying voltages to the various terminals of the various RRAM RPU unit cells, or the addition of inverters while maintaining the same logic for applying voltages to the various terminals.

In some embodiments, an RPU comprises a first analog memory element, a second analog memory element connected in series with the first analog memory element, and a control circuit coupled to the first analog memory element and the second analog memory element, the control circuit configured to read a synaptic weight value of the RPU by collecting a differential current from the first analog memory element and the second analog memory element on at least one of a read column line and a read row line coupled to a terminal coupling the first analog memory element and the second analog memory element.

The first analog memory element and the second analog memory element may comprise RRAM devices.

The control circuit is configured, in a forward pass operation, to measure the differential current on the read column line and, in a backward pass operation, to measure the differential current on the read row line. The differential current is determined according to equation (1) above, where I1 is the current across the first analog memory element, I2 is the current across the second analog memory element, Vr is a voltage difference across the first and second analog memory elements, g1 is the conductance of the first analog memory element, and g2 is the conductance of the second analog memory element. The sign of (g1-g2) corresponds to the sign of the synaptic weight of the resistive processing unit.

In some embodiments, the control circuit comprises a first pass transistor comprising a gate, a first source/drain terminal and a second source/drain terminal, and a second pass transistor comprising a gate, a first source/drain terminal and a second source/drain terminal. The gate of the first pass transistor is coupled to a first control line and the gate of the second pass transistor is coupled to a second control line. The first source/drain terminal of the first pass transistor is coupled to the read row line and the second source/drain terminal of the second pass transistor is coupled to the read column line. The second source/drain terminal of the first pass transistor is coupled to the first source/drain terminal of the second pass transistor and the terminal coupling the first and second analog memory elements.

In the forward pass operation, the control circuit is configured to apply a voltage difference across the first and second analog memory elements, to apply a first fixed voltage to the first control line to turn off the first pass transistor, to apply a read pulse voltage to the second control line to turn on the second pass transistor when the read pulse is at a given voltage, and to read the differential current on the read column line when the read pulse is at the given voltage.

In the backward pass operation, the control circuit is configured to apply a voltage difference across the first and second analog memory elements, to apply a first fixed voltage to the second control line to turn off the second pass transistor, to apply a read pulse voltage to the first control line to turn on the first pass transistor when the read pulse is at a given voltage, and to read the differential current on the read row line when the read pulse is at the given voltage.

In a weight update operation, the control circuit is configured to apply synchronized pulses to a first terminal of the first analog memory element and to a second terminal of the second analog memory element, a second terminal of the first analog memory element being coupled to a first terminal of the second analog memory element, to apply a first fixed voltage to the first control line to at least partially turn on the first pass transistor, to apply a second fixed voltage to the second control line to turn off the second pass transistor, and to apply a pulse voltage to the read row line. The weight update is a positive weight update that increases a conductance of the first analog memory element and decreases a conductance of the second analog memory element when the pulse voltage applied to the read row line is negative and coincident with positive synchronized pulses applied to the first terminal and the second terminal. The weight update is a negative weight update that decreases the conductance of the first analog memory element and increases the conductance of the second analog memory element when the pulse voltage applied to the read row line is positive and coincident with negative synchronized pulses applied to the first terminal and the second terminal.

The control circuit may further comprise an AND logic gate coupled to the first control line, and the control circuit is configured in a weight update operation to apply a first fixed voltage to a first terminal of the first analog memory element and to a second terminal of the second analog memory element, a second terminal of the first analog memory element being coupled to a first terminal of the second analog memory element, to apply pulse voltages to a first terminal and a second terminal of the AND logic gate coupled to the first control line to at least partially turn on the first pass transistor when the pulse voltages applied to the first terminal and the second terminal of the AND logic gate are coincident, to apply a second fixed voltage to the second control line to turn off the second pass transistor, and to apply a third fixed voltage to the read row line. The weight update is a positive weight update that increases a conductance of the first analog memory element and decreases a conductance of the second analog memory element when the first fixed voltage is a first value, the third fixed voltage is a second value lower than the first value, and the first pass transistor is at least partially turned on. The weight update is a negative weight update that decreases the conductance of the first analog memory element and increases the conductance of the second analog memory element when the first fixed voltage is the second value, the third fixed voltage is the first value, and the first pass transistor is at least partially turned on.

In other embodiments, the control circuit comprises a first pass transistor comprising a gate, a first source/drain terminal and a second source/drain terminal and a second pass transistor comprising a gate, a first source/drain terminal and a second source/drain terminal. The gate of the first pass transistor is coupled to the read column line and the gate of the second pass transistor is coupled to the read row line. The first source/drain terminal of the first pass transistor is coupled to the read row line and the second source/drain terminal of the second pass transistor is coupled to the read column line. The second source/drain terminal of the first pass transistor is coupled to the first source/drain terminal of the second pass transistor and the terminal coupling the first and second analog memory elements.

In a forward pass operation, the control circuit is configured to apply a voltage difference across the first and second analog memory elements, to apply a first fixed voltage to the read column line to turn off the first pass transistor, to apply a read pulse voltage to the read row line, and to read the differential current on the read column line when the second pass transistor is turned on by the read pulse voltage. In a backward pass operation, the control circuit is configured to apply the voltage difference across the first and second analog memory elements, to apply the first fixed voltage to the read row line to turn off the second pass transistor, to apply the read pulse voltage to the read column line, and to read the differential current on the read row line when the first pass transistor is turned on by the read pulse voltage.

In a weight update operation, the control circuit is configured to apply a synchronized first pulse voltage to a first terminal of the first analog memory element and to a second terminal of the second analog memory element, a second terminal of the first analog memory element being coupled to a first terminal of the second analog memory element, to apply a second pulse voltage to the read row line, and to apply a fixed voltage to the read column line that turns off the first pass transistor. The weight update occurs when the first synchronized pulse voltage is coincident with the second pulse voltage and the second pulse voltage turns on the second pass transistor.

In other embodiments, the control circuit comprises a first pass transistor comprising a gate, a first source/drain terminal and a second source/drain terminal, a second pass transistor comprising a gate, a first source/drain terminal and a second source/drain terminal, and an analog selector. The gate of the first pass transistor is coupled to the read column line and the gate of the second pass transistor is coupled to the read row line. The first source/drain terminal of the first pass transistor is coupled to the read row line and the second source/drain terminal of the second pass transistor is coupled to the read column line. The second source/drain terminal of the first pass transistor is coupled, via the analog selector, to the first source/drain terminal of the second pass transistor and the terminal coupling the first and second analog memory elements.

The control circuit may further comprise a NAND logic gate coupled to a third transistor, the NAND logic gate comprising a first terminal coupled to the read column line and a second terminal coupled to the read row line, the third transistor comprising a gate coupled to an output of the NAND logic gate, a first source/drain terminal coupled to the terminal coupling the first and second analog memory elements, and a second source/drain terminal coupled to a supply voltage.

The analog selector may comprise a read enable terminal coupled to gates of a fourth transistor and a fifth transistor, a first source/drain terminal of the fourth transistor being coupled to the second source/drain terminal of the first pass transistor, a first source/drain terminal of the fifth transistor being coupled to the first source/drain terminal of the first pass transistor, and a second source/drain terminal of the fourth transistor being coupled to a second source/drain terminal of the fifth transistor and to the terminal coupling the first and second analog memory elements.

In some embodiments, an integrated circuit may comprise an array of RPUs described herein.

In some embodiments, a method for differential weight reading of an RPU comprises applying a voltage difference across a first analog memory element and a second analog memory element of the RPU utilizing a control circuit, the first analog memory element being connected in series with the second analog memory element, applying one or more read pulse voltages utilizing the control circuit, and reading a synaptic weight value of the RPU by collecting a differential current from the first analog memory element and the second analog memory element on at least one of a read column line and a read row line coupled to a terminal between the first analog memory element and the second analog memory element. The method may further include performing a weight update to simultaneously update a conductance of the first analog memory element and a conductance of the second analog memory element.

In the description above, various materials, dimensions and ranges of values for different elements are provided. Unless otherwise noted, such materials are given by way of example only and embodiments are not limited solely to the specific examples given. Similarly, unless otherwise noted, all dimensions and ranges are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A resistive processing unit, comprising:
   a first analog memory element;
   a second analog memory element connected in series with the first analog memory element; and
   a control circuit coupled to the first analog memory element and the second analog memory element, the control circuit configured to read a synaptic weight value of the resistive processing unit by collecting a differential current from the first analog memory element and the second analog memory element on at least one of a read column line and a read row line coupled to a terminal coupling the first analog memory element and the second analog memory element.

2. The resistive processing unit of claim 1, wherein the first analog memory element and the second analog memory element comprise resistive random-access memory (RRAM) devices.

3. The resistive processing unit of claim 1, wherein the control circuit is configured, in a forward pass operation, to measure the differential current on the read column line.

4. The resistive processing unit of claim 1, wherein the control circuit is configured, in a backward pass operation, to measure the differential current on the read row line.

5. The resistive processing unit of claim 1, wherein the differential current is determined according to:

$$I = I1 - I2 = \frac{1}{2}Vr(g1 - g2)$$

where I1 is the current across the first analog memory element, I2 is the current across the second analog memory element, Vr is a voltage difference across the first and second analog memory elements, g1 is the conductance of the first analog memory element, and g2 is the conductance of the second analog memory element.

6. The resistive processing unit of claim 5, wherein the sign of (g1-g2) corresponds to the sign of the synaptic weight of the resistive processing unit.

7. The resistive processing unit of claim 1, wherein the control circuit comprises:
a first pass transistor comprising a gate, a first source/drain terminal and a second source/drain terminal; and
a second pass transistor comprising a gate, a first source/drain terminal and a second source/drain terminal;
wherein the gate of the first pass transistor is coupled to a first control line and the gate of the second pass transistor is coupled to a second control line;
wherein the first source/drain terminal of the first pass transistor is coupled to the read row line and the second source/drain terminal of the second pass transistor is coupled to the read column line;
wherein the second source/drain terminal of the first pass transistor is coupled to the first source/drain terminal of the second pass transistor and the terminal coupling the first and second analog memory elements.

8. The resistive processing unit of claim 7, wherein the control circuit is configured in a forward pass operation:
to apply a voltage difference across the first and second analog memory elements;
to apply a first fixed voltage to the first control line to turn off the first pass transistor;
to apply a read pulse voltage to the second control line to turn on the second pass transistor when the read pulse is at a given voltage; and
to read the differential current on the read column line when the read pulse is at the given voltage.

9. The resistive processing unit of claim 7, wherein the control circuit is configured in a backward pass operation:
to apply a voltage difference across the first and second analog memory elements;
to apply a first fixed voltage to the second control line to turn off the second pass transistor;
to apply a read pulse voltage to the first control line to turn on the first pass transistor when the read pulse is at a given voltage; and
to read the differential current on the read row line when the read pulse is at the given voltage.

10. The resistive processing unit of claim 7, wherein the control circuit is configured in a weight update operation:
to apply synchronized pulses to a first terminal of the first analog memory element and to a second terminal of the second analog memory element, a second terminal of the first analog memory element being coupled to a first terminal of the second analog memory element;
to apply a first fixed voltage to the first control line to at least partially turn on the first pass transistor;
to apply a second fixed voltage to the second control line to turn off the second pass transistor; and
to apply a pulse voltage to the read row line;
wherein the weight update is a positive weight update that increases a conductance of the first analog memory element and decreases a conductance of the second analog memory element when the pulse voltage applied to the read row line is negative and coincident with positive synchronized pulses applied to the first terminal and the second terminal; and
wherein the weight update is a negative weight update that decreases the conductance of the first analog memory element and increases the conductance of the second analog memory element when the pulse voltage applied to the read row line is positive and coincident with negative synchronized pulses applied to the first terminal and the second terminal.

11. The resistive processing unit of claim 7, wherein the control circuit further comprises an AND logic gate coupled to the first control line, and wherein the control circuit is configured in a weight update operation:
to apply a first fixed voltage to a first terminal of the first analog memory element and to a second terminal of the second analog memory element, a second terminal of the first analog memory element being coupled to a first terminal of the second analog memory element;
to apply pulse voltages to a first terminal and a second terminal of the AND logic gate coupled to the first control line to at least partially turn on the first pass transistor when the pulse voltages applied to the first terminal and the second terminal of the AND logic gate are coincident;
to apply a second fixed voltage to the second control line to turn off the second pass transistor; and
to apply a third fixed voltage to the read row line;
wherein the weight update is a positive weight update that increases a conductance of the first analog memory element and decreases a conductance of the second analog memory element when the first fixed voltage is a first value, the third fixed voltage is a second value lower than the first value, and the first pass transistor is at least partially turned on; and
wherein the weight update is a negative weight update that decreases the conductance of the first analog memory element and increases the conductance of the second analog memory element when the first fixed voltage is the second value, the third fixed voltage is the first value, and the first pass transistor is at least partially turned on.

12. The resistive processing unit of claim 1, wherein the control circuit comprises:
a first pass transistor comprising a gate, a first source/drain terminal and a second source/drain terminal; and
a second pass transistor comprising a gate, a first source/drain terminal and a second source/drain terminal;
wherein the gate of the first pass transistor is coupled to the read column line and the gate of the second pass transistor is coupled to the read row line;

wherein the first source/drain terminal of the first pass transistor is coupled to the read row line and the second source/drain terminal of the second pass transistor is coupled to the read column line;

wherein the second source/drain terminal of the first pass transistor is coupled to the first source/drain terminal of the second pass transistor and the terminal coupling the first and second analog memory elements.

13. The resistive processing unit of claim 12, wherein the control circuit is configured:
in a forward pass operation:
to apply a voltage difference across the first and second analog memory elements;
to apply a first fixed voltage to the read column line to turn off the first pass transistor;
to apply a read pulse voltage to the read row line; and
to read the differential current on the read column line when the second pass transistor is turned on by the read pulse voltage;
in a backward pass operation:
to apply the voltage difference across the first and second analog memory elements;
to apply the first fixed voltage to the read row line to turn off the second pass transistor;
to apply the read pulse voltage to the read column line; and
to read the differential current on the read row line when the first pass transistor is turned on by the read pulse voltage.

14. The resistive processing unit of claim 12, wherein the control circuit is configured in a weight update operation:
to apply a synchronized first pulse voltage to a first terminal of the first analog memory element and to a second terminal of the second analog memory element, a second terminal of the first analog memory element being coupled to a first terminal of the second analog memory element;
to apply a second pulse voltage to the read row line; and
to apply a fixed voltage to the read column line that turns off the first pass transistor;
wherein the weight update occurs when the first synchronized pulse voltage is coincident with the second pulse voltage and the second pulse voltage turns on the second pass transistor.

15. The resistive processing unit of claim 1, wherein the control circuit comprises:
a first pass transistor comprising a gate, a first source/drain terminal and a second source/drain terminal;
a second pass transistor comprising a gate, a first source/drain terminal and a second source/drain terminal; and
an analog selector;
wherein the gate of the first pass transistor is coupled to the read column line and the gate of the second pass transistor is coupled to the read row line;
wherein the first source/drain terminal of the first pass transistor is coupled to the read row line and the second source/drain terminal of the second pass transistor is coupled to the read column line;
wherein the second source/drain terminal of the first pass transistor is coupled, via the analog selector, to the first source/drain terminal of the second pass transistor and the terminal coupling the first and second analog memory elements.

16. The resistive processing unit of claim 15, wherein the control circuit further comprises a NAND logic gate coupled to a third transistor, the NAND logic gate comprising a first terminal coupled to the read column line and a second terminal coupled to the read row line, the third transistor comprising a gate coupled to an output of the NAND logic gate, a first source/drain terminal coupled to the terminal coupling the first and second analog memory elements, and a second source/drain terminal coupled to a supply voltage.

17. The resistive processing unit of claim 16, wherein the analog selector comprises a read enable terminal coupled to gates of a fourth transistor and a fifth transistor, a first source/drain terminal of the fourth transistor being coupled to the second source/drain terminal of the first pass transistor, a first source/drain terminal of the fifth transistor being coupled to the first source/drain terminal of the first pass transistor, and a second source/drain terminal of the fourth transistor being coupled to a second source/drain terminal of the fifth transistor and to the terminal coupling the first and second analog memory elements.

18. An integrated circuit comprising:
an array of two or more resistive processing units;
wherein a given one of the resistive processing units comprises:
a first analog memory element;
a second analog memory element connected in series with the first analog memory element; and
a control circuit coupled to the first analog memory element and the second analog memory element, the control circuit configured to read out a synaptic weight value of the resistive processing unit by collecting a differential current from the first analog memory element and the second analog memory element.

19. A method for differential weight reading of a resistive processing unit, comprising:
applying a voltage difference across a first analog memory element and a second analog memory element of the resistive processing unit utilizing a control circuit, the first analog memory element being connected in series with the second analog memory element;
applying one or more read pulse voltages utilizing the control circuit; and
reading a synaptic weight value of the resistive processing unit by collecting a differential current from the first analog memory element and the second analog memory element on at least one of a read column line and a read row line coupled to a terminal between the first analog memory element and the second analog memory element.

20. The method of claim 19, further comprising performing a weight update to simultaneously update a conductance of the first analog memory element and a conductance of the second analog memory element.

* * * * *